(12) United States Patent
Enquist et al.

(10) Patent No.: US 7,622,324 B2
(45) Date of Patent: Nov. 24, 2009

(54) WAFER BONDING HERMETIC ENCAPSULATION

(75) Inventors: Paul M. Enquist, Cary, NC (US); Qin-Yi Tong, Durham, NC (US); Gaius Gillman Fountain, Jr., Youngsville, NC (US); Robert Markunas, Chapel Hill, NC (US)

(73) Assignee: Ziptronix, Research Triangle Park, NC (US)

( * ) Notice: Subject to any disclaimer, the term of this patent is extended or adjusted under 35 U.S.C. 154(b) by 0 days.

(21) Appl. No.: 10/913,357

(22) Filed: Aug. 9, 2004

(65) Prior Publication Data

US 2005/0009246 A1 Jan. 13, 2005

Related U.S. Application Data

(62) Division of application No. 10/253,588, filed on Sep. 25, 2002, now Pat. No. 6,822,326.

(51) Int. Cl.
*H01L 21/00* (2006.01)
(52) U.S. Cl. .................. 438/106; 438/118; 438/127; 438/455; 257/E21.499
(58) Field of Classification Search .......... 438/127, 438/118, 106, 455, 456; 257/E21.499
See application file for complete search history.

(56) References Cited

U.S. PATENT DOCUMENTS

| | | | |
|---|---|---|---|
| 5,389,569 A * | 2/1995 | Cambou et al. | 438/422 |
| 5,501,003 A | 3/1996 | Bernstein | |
| 5,516,727 A | 5/1996 | Broom | |
| 5,610,431 A * | 3/1997 | Martin | 257/415 |
| 5,821,692 A | 10/1998 | Rogers et al. | |
| 5,866,942 A | 2/1999 | Suzuki et al. | |
| 6,071,761 A | 6/2000 | Jacobs | |
| 6,146,917 A * | 11/2000 | Zhang et al. | 438/51 |
| 6,232,150 B1 | 5/2001 | Lin et al. | |
| 6,297,072 B1 | 10/2001 | Tilmans et al. | |
| 6,624,003 B1 | 9/2003 | Rice | |
| 6,627,814 B1 | 9/2003 | Stark | |
| 6,660,564 B2 | 12/2003 | Brady | |

FOREIGN PATENT DOCUMENTS

WO    WO 01/61743 A1 *    8/2001

* cited by examiner

*Primary Examiner*—Michael Trinh
(74) *Attorney, Agent, or Firm*—Oblon, Spivak, McClelland, Maier & Neustadt, L.L.P.

(57) ABSTRACT

A method for providing encapsulation of an electronic device which obtains an encapsulating member configured to enclose the electronic device, prepares a surface of the encapsulating member for non-adhesive direct bonding, prepares a surface of a device carrier including the electronic device for non-adhesive direct bonding, and bonds the prepared surface of the encapsulating member to the prepared surface of the device carrier to form an encapsulation of the electronic device. As such, an encapsulated electronic device results which includes the device carrier having a first bonding region encompassing the electronic device, includes the encapsulating member having at least one relief preventing contact between the electronic device and the encapsulating member and having a second bonding region bonded to the first bonding region of the device carrier, and includes a non-adhesive direct bond formed between the first and second bonding regions thereby to form an encapsulation of the electronic device. The encapsulated electronic device can be an electronic or optoelectronic device.

95 Claims, 24 Drawing Sheets

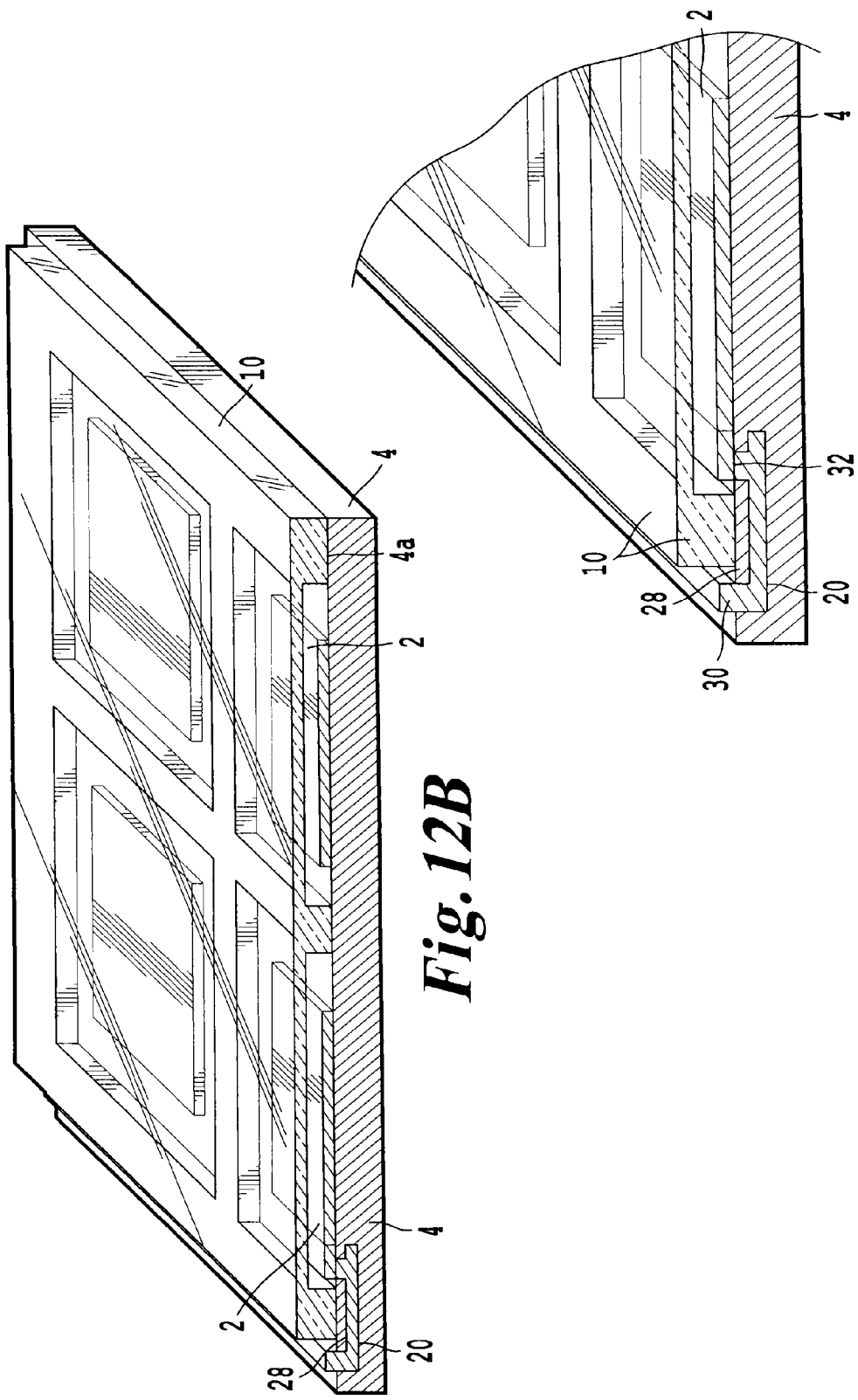

WAFER BONDING HERMETIC ENCAPSULATION

CROSS-REFERENCE TO RELATED APPLICATIONS

This application is related to U.S. patent application Method for Low Temperature Bonding and Bonded Structure, Ser. No. 09/505,283, filed Feb. 16, 2000, now U.S. Pat. No. 6,902,987, the entire contents of which are incorporated herein by reference, is related to U.S. patent application Three Dimensional Device Integration Method and Integrated Device, Ser. No. 09/410,054, filed Oct. 1, 1999, now U.S. Pat. No. 6,984,571, the entire contents of which are incorporated herein by reference, and is related to U.S. patent application Three Dimensional Device Integration Method and Integrated Device, Ser. No. 09/532,886, filed Mar. 22, 2000, now U.S. Pat. No. 6,500,694, the entire contents of which are incorporated herein by reference.

BACKGROUND OF THE INVENTION

1. Field of the Invention

The invention is related to the packaging and encapsulation of semiconductor devices, including electronic devices, opto-electronic devices, microelectromechanical system (MEMS) devices, and high-frequency devices.

2. Discussion of the Background

In order to protect semiconductor chip devices from environmental hazards, device manufacturers have developed a variety of ways for hermetically encapsulating integrated circuit or discrete devices. Many of these techniques rely on adhesive seals or low-temperature solder for low temperature sealing of a cover to a printed wiring board of a substrate including integrated circuits or discrete devices, respectively.

Techniques, such as those disclosed by Rogers et al (U.S. Pat. No. 5,821,692), the entire contents of which are incorporated herein by reference, utilize peripheral seals around a device to provide one level of protection and then encapsulate the device in a fluorinated carbon liquid to add further protection from the environment. Techniques, such as those disclosed by Jacobs (U.S. Pat. No. 6,071,761), the entire contents of which are incorporated herein by reference, encapsulate devices in a polymer resistant to deterioration and resistant to ambient moisture. While effective in sealing the devices from the outside environment, the introduction of foreign materials into direct contact with the devices can impede operation of the devices and over time can contribute to the contamination and failure of the devices. Broom (U.S. Pat. No. 5,516,727), the entire contents of which are incorporated herein by reference, discloses contamination and failure of light-emitting diodes encapsulated in a resin.

A number of alternatives to resin encapsulation of semiconductor devices have been developed for providing sealed hermetic protection of the devices without direct contact between the resin and the encapsulated devices. For example, Bernstein (U.S. Pat. No. 5,501,003), the entire contents of which are incorporated herein by reference, discloses a process in which a non-conductive frame is attached to a conductive lead frame (i.e. a printed wiring board) containing connections to an assembled electronic package. The non-conductive frame is attached and sealed to the conductive lead frame using an ultraviolet curable epoxy applied around a periphery of the conductive lead frame. The electronic package is thus encapsulated having an interior air gap with no interior resin in contact with the encapsulated devices. Similarly, Suzuki et al (U.S. Pat. No. 5,866,942), the entire contents of which are incorporated herein by reference, disclose a metal base package for a semiconductor device in which a cap is adhesively bonded to either a laminated metal base or a metal foil pattern on an large scale integrated (LSI) chip.

The hermetic encapsulation of theses devices depend on the integrity and longevity of the adhesive and the adhesive bond. The adhesive bond is frequently made between dissimilar materials having dissimilar thermomechanical properties from each other and from the adhesive used. As a consequence, the adhesive bond is subject to failure with time and is especially prone to failure during heat cycles.

With the recent interest in micro-electrical mechanical systems (MEMS) devices has come the need for more critical device encapsulation techniques. Lin et al (U.S. Pat. No. 6,232,150), the entire contents of which are incorporated herein by reference, disclose unique problems associated with MEMS devices and disclose the need for reliable encapsulation of MEMS devices which does not contaminate or impede the operation of miniaturized mechanical MEMS devices. For example, MEMS devices require encapsulation without contact or contamination to the enclosed accelerometers, pressure transducers, gyroscopes, and micro-resonators. Furthermore, this encapsulation may require the enclosure of getters or other chemistry, designed to improve the device reliability, for example stiction reduction, without adversely affecting the effectiveness of this chemistry. Lin et al describe prior art encapsulation techniques for MEMS devices and the shortcomings of those approaches. In particular, Lin et al disclose the incompatibility of elevated temperature global heating for the encapsulation of MEMS devices. To alleviate global heating, Lin et al disclose the fabrication of microheaters which locally heat a bonding surface of a cover cap above a MEMS device, thereby sealing the cover cap to the body of the MEMS devices. The complexity of the patterning and the operation of the micro-heaters add cost and are deterrents to the acceptance and utilization of microheaters.

SUMMARY OF THE INVENTION

One object of the present invention is to provide a method for encapsulation which does not rely on encapsulation of an electronic device in a resin.

Another object of the present invention is to provide a method for encapsulation which does not rely on adhesive bonding to provide sealing of an internal relief containing the electronic device.

Another object of the present invention is to provide a method for encapsulation which does not require the fabrication of microheaters to produce localized heating.

Still another object of the invention is to provide a reliable low-temperature method for encapsulation of an electronic device.

A further object of the present invention is to provide a low cost and reliable method for encapsulation of an electronic device.

Still another object of the present invention is to provide simultaneous encapsulation of all devices on a device carrier containing the electronic devices.

Still another object of the present invention is to hermetically encapsulate MEMS devices.

Still another object of the present invention is to provide an encapsulation that results in minimum strain when exposed to temperature variations.

A further object of the present invention is to provide encapsulation that does not adversely affect the effectiveness of getters or other chemistry within the encapsulation.

Still another object of the present invention is to encapsulate MEMS early in the fabrication cycle.

Still another object of the invention is to improve the yield of MEMS devices by encapsulating MEMS devices at wafer scale early in the fabrication cycle.

Still another object of the invention is to provide an encapsulation that provides structural support for a MEMS device.

These and other objects of the present invention are achieved according to the present invention by a method which obtains an encapsulating member configured to enclose the electronic device, prepares a surface of the encapsulating member for non-adhesive direct bonding, prepares a surface of a device carrier including the electronic device for non-adhesive direct bonding and bonds, at or near room temperature, the prepared surface of the encapsulating member to the prepared surface of the device carrier to form an encapsulation of the electronic device.

Thus, in one aspect of the present invention, an encapsulated electronic or optoelectronic device, referred to as an (opto)electronic device, is produced having a device carrier including an (opto)electronic chip device and including a first bonding region encompassing the (opto)electronic chip device. The encapsulated (opto)electronic device includes an encapsulating member having a second bonding region. The encapsulating member is bonded to the device carrier along the first and second bonding regions by means of a non-adhesive direct contact bond. The encapsulating member provides a relief for the (opto)electronic chip device. Non-adhesive direct bonds are formed at low temperature (i.e. near room temperature) between the first and second bonding regions to encapsulate the (opto)electronic chip device.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein:

FIGS. 12A, 12B, 12B-1 and 12C are schematics illustrating approaches, according to the present invention, for providing electrical connection to the hermetically encapsulated devices of the present invention through the substrate of an encapsulated device or laterally between the encapsulated device substrate and the encapsulating member;

DETAILED DESCRIPTION OF THE INVENTION

As previously noted, hermetic encapsulation is required for a number of semiconductor devices. In particular, MEMS devices require hermetic sealing to ensure a long lifetime of moving mechanical parts within them. Furthermore, this sealing may require the inclusion of getters, without adversely affecting either the sealing or the getters, to improve the mechanical or other reliability. Typical MEMS hermetic encapsulating techniques are awkward and costly. Consequently, the cost of MEMS hermetic encapsulation is comparable to or can exceed the cost of the fabrication of the MEMS wafer. Current techniques, as previously described, utilized for hermetic encapsulation of MEMS devices include soldering, eutectic metal bonding, and wafer fusion.

In the present invention, improved reliability and substantially reduced costs are obtained by encapsulation of devices using direct, low temperature bonding. The devices enclosed in the encapsulation of the present invention can include but are not limited to micro-electrical mechanical systems MEMS devices, radio frequency devices, and optoelectronic devices, and other devices requiring a robust hermetic low temperature encapsulation. Thus, while the present invention is not limited to applications involving encapsulation of a specific device, the encapsulation of MEMS devices is an important area of application for the present invention and is used frequently below by way of example to provide specifics for the present invention.

Devices including MEMS devices can be categorized as concave or convex devices. A concave MEMS device is one in which the entire MEMS device is below the wafer surface surrounding the MEMS device where the hermetic encapsulation is desired. An example of a typical concave MEMS device is a pressure sensor. A convex MEMS device is a device in which a portion of the MEMS device extends above the wafer surface. Encapsulation is desired for the entire MEMS device including the portion extending above the surface. An example of a typical convex MEMS device is a radio frequency switch or micromirror.

Figure 1A:
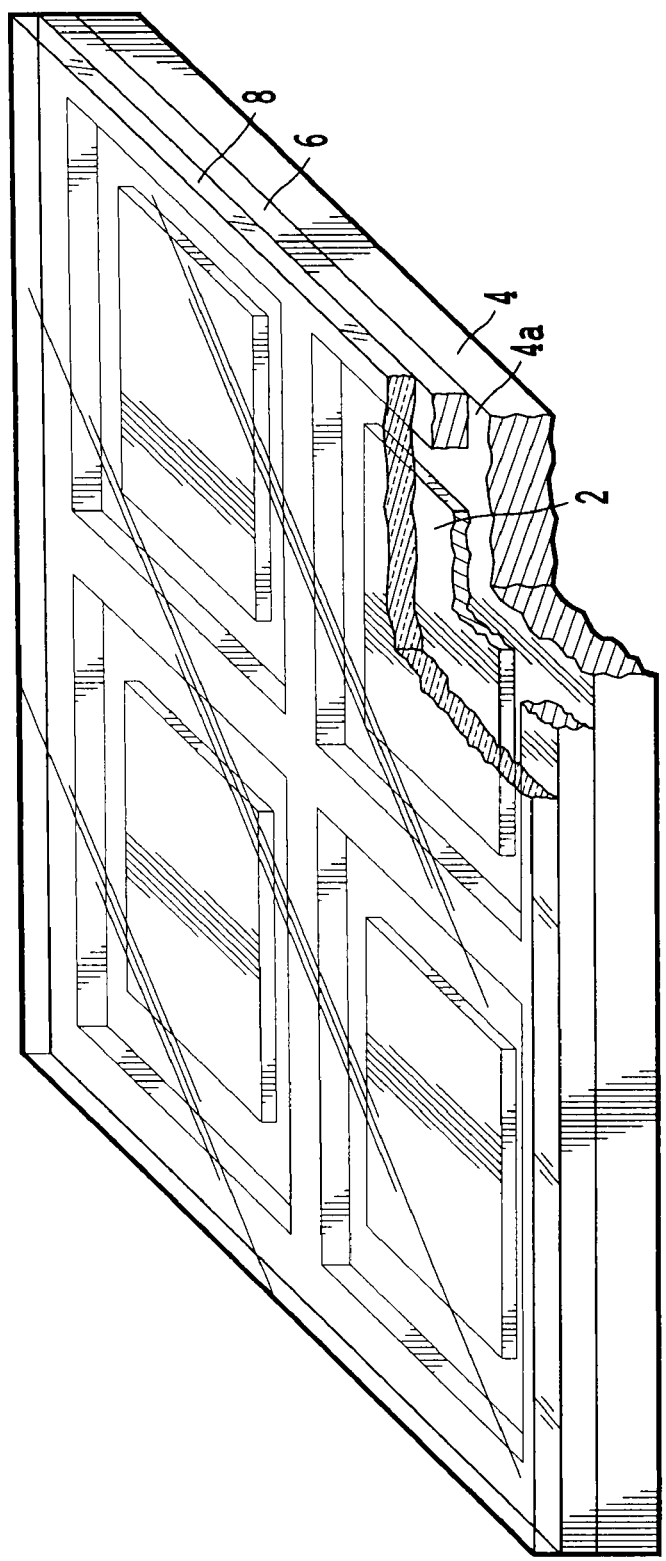
FIG. 1A is a schematic depicting a set of encapsulated convex devices, according to the present invention, sealed and compartmentalized as individual devices.

Referring now to the drawings, wherein like reference numerals designate identical or corresponding parts throughout the several views, FIG. 1A is a schematic depicting a set of encapsulated convex devices, according to the present invention, sealed and compartmentalized as individual devices.

FIG. 1A illustrates an (opto)electronic device 2 disposed on a device carrier 4 (i.e. an electronic chip). Only a portion of the device carrier is shown for brevity. Carrier 4 may be silicon, silicon on insulator, an insulating material such as glass, quartz or diamond-like carbon, or a combination of these materials. While device 2 is shown formed on carrier 4, device 2 may be formed in carrier 4 (as illustrated below in FIGS. 13A-13B for MEMS 135 in carrier 136), for example when carrier 4 is a silicon wafer. The figures are intended to illustrate the principles of the invention and are not meant to limit the configuration of the device 2 relative to the carrier 4. Device 2 may be formed on or in the carrier, and device 2 and carrier 4 may be formed of the same or different materials. Device 2 may extend above the surface of carrier 4, it may be below the surface of carrier 4, or it may be a part of the surface of carrier 4. Many combinations and configurations are possible, and each are capable of be used in the invention.

In this embodiment, the device 2 has a convex configuration (i.e., the device is raised above the surface of the device carrier 4). According to the present invention, an encapsulating member including an interposer 6 and a cover plate 8 encloses the convex device 2 Interposer 6 and cover 8 may be made of silicon, silicon dioxide, or quartz, for example. The thickness of cover 8 may be 0.1 mm or less, depending on the requirements of the application such as mechanical strength or thickness of the configuration It is noted that cover 8 is shown as transparent for ease of illustrating the devices 2, but will be opaque in the usual case, such as a silicon cover. The interposer 8 is used to provide clearance or headspace between the device 2 and a bottom surface of the cover 8 The clearance provided is sufficient to prevent contact between the convex device 2 and the cover 8 As illustrated in FIG. 1A, the interposer 6 is formed with a shape contoured in relation to the perimeter regions of the devices 2 such that a bonding of the interposer 6 to the device carrier 4 does not interfere with the components of the device 2 The bottom surface of interposer 6 is brought into direct contact with the areas 4a on carrier 4 and bonded. Bonding occurs between the regions 4a of the carrier surface and the bottom of the interposer 6 The bonding initiates on contact and propagates to a stronger bond, as discussed in more detail below. The bonding need not be accompanied by applied pressure or temperature, i.e. it may be conducted at room temperature. The bonding also need not be conducted in vacuum, but may be conducted in ambient.

The regions 4a typically have a surface roughness, according to the present invention, of less than 5-10 Å, and preferably less than 5', and a surface planarity of less than 0.1 μm over a 100 μm range. The mechanical and chemical specification is discussed in more detail below, but in general a surface with a surface roughness of about 5' and a planarity of 0.1 μm over a 100 μm range and, preferably, activation will permit the low-temperature (i.e., room temperature to 100° C., where temperatures above room temperature are not necessarily required) non-adhesive direct bonding of the present invention.

Such regions can be polished to this specification, can be maintained at this specification during the fabrication of the devices 2 on the device carrier 4, can be revealed by the removal of a sacrificial layer, or can be planarized with a deposited dielectric having this specification upon deposition or subsequent polishing after deposition of the dielectric. The regions 4a may be any size that will adequately bond to interposer 6 and ensure a complete and secure hermetic seal, and allow simple alignment.

Activation of the regions 4a, as discussed in more detail below, promotes high strength bonding to occur at or near room temperature conditions, thereby enabling low temperature encapsulation of the devices 2 in a sealed package without the need for high temperature anneals or the introduction of a foreign adhesive layer prone to failure. Moreover, the strength of this bond is typically sufficient, with commonly used materials, to result in a hermetic seal. Furthermore, the strength of the bond increases on temperature excursions and with time, thus improving the longevity and reliability of the hermetic encapsulation as compared to sealing with adhesives which are prone to fatigue and failure with repetitive temperature excursions.

The hermetic nature of the seal is typically proven with a mil spec method that includes a combination of pressurization with helium, to try to inject helium through the seal into the encapsulated space, followed by vacuum analysis of the encapsulated part to detect leakage of helium out of the encapsulated part. The encapsulation method of the subject invention is not limited to parts that pass this test. For example, the subject invention can also be used with materials that absorb helium, for example glass and quartz, so that this measurement technique may indicate helium that is desorbing from these other materials instead of through the seal.

Figure 1B:
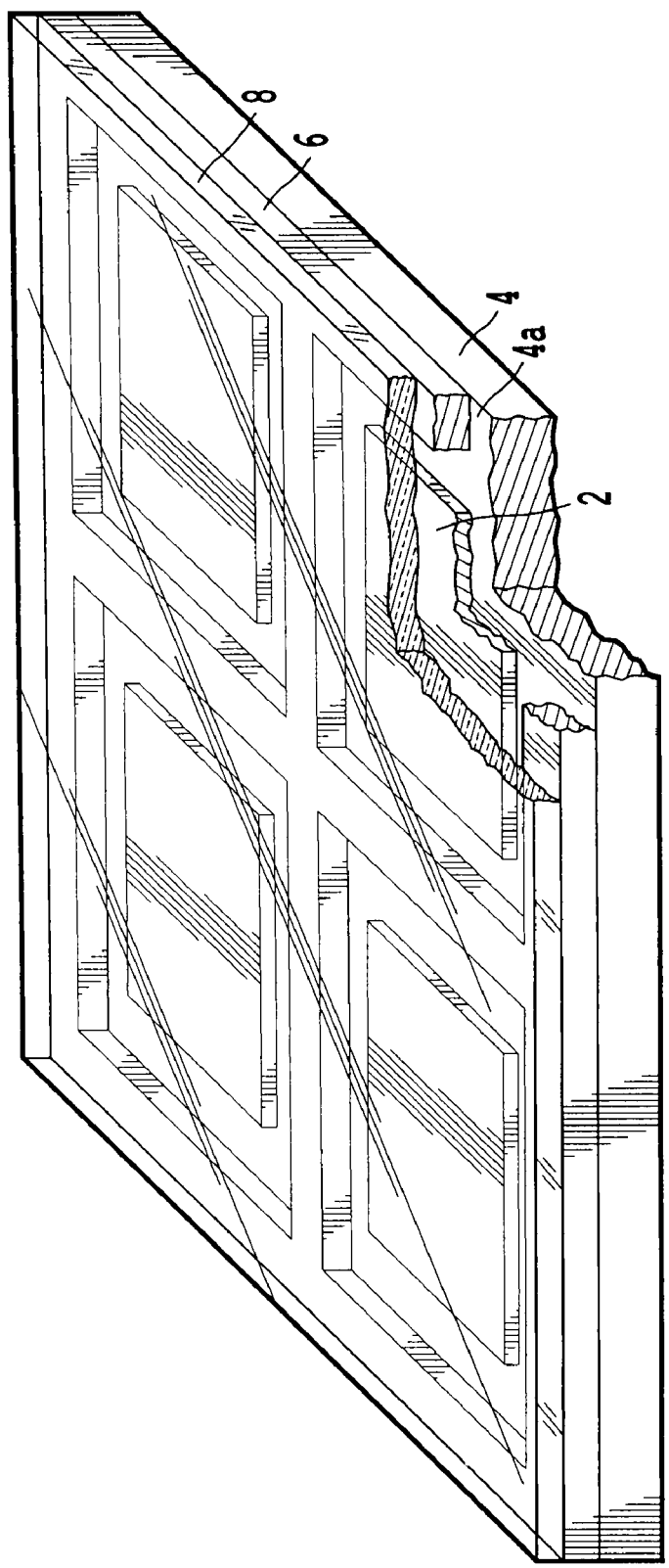
FIG. 1B is a schematic depicting another set of encapsulated convex devices, according to the present invention, sealed and compartmentalized as multiple devices.

FIG. 1B is a schematic depicting another set of encapsulated convex devices sealed by use of an interposer which compartmentalizes multiple devices. FIG. 1B shows by way of example that the interposer 8 does not compartmentalize an individual device 2 into a singular compartment, but rather each singular compartment compartmentalizes multiple devices 2. In FIGS. 1A and 1B, a device 2 or multiple devices 2 are hermetically encapsulated by non-adhesive direct bonding of the cover 8 to the interposer 6 and by bonding of the interposer 6 to the device carrier 4. These bonds can be made during a simultaneous bonding of all the surfaces at once, or in sequential steps of, for example, bonding the interposer 6 to the device carrier 4 followed by bonding the cover 8 to the interposer 6, or by bonding the interposer 6 to cover 8 and bonding the combined cover 8 and interposer 6 as a unit to device carrier 4.

According to the present invention, the bonding surfaces of the interposer 6 (i.e., the top and bottom surfaces), the device carrier 4 (i.e., the surfaces on delineated regions 4a around the devices 2), and the cover 8 are prepared to have a specified mechanical and chemical specification sufficient for non-adhesive direct bonding, as discussed above. In general a properly activated surface with a surface roughness of preferably about 5' or less and a planarity of 0.1 μm over a 100 μm range will permit the low-temperature (i.e., room temperature to 100° C.) non-adhesive direct bonding of the present invention. It is also possible to obtain a cover already having the surface roughness and planarity in the desired ranges. For example, in the case of a silicon cover, a wafer vendor may be able to supply a cover 8 with meeting the desired mechanical specifications.

Figure 2A:
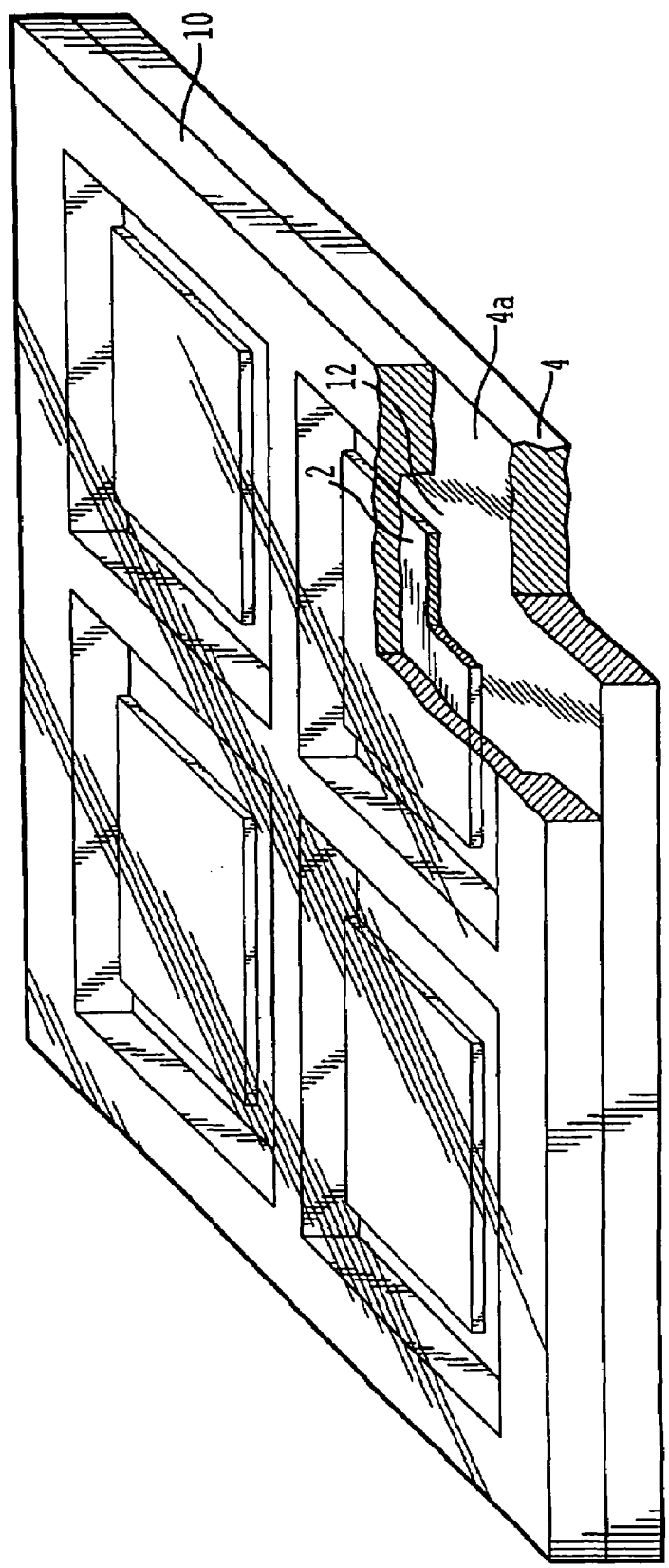
FIG. 2A is a schematic depicting another set of encapsulated convex devices, according to the present invention, sealed by an encapsulating member having a relief for clearance from the encapsulated device.
Figure 2B:
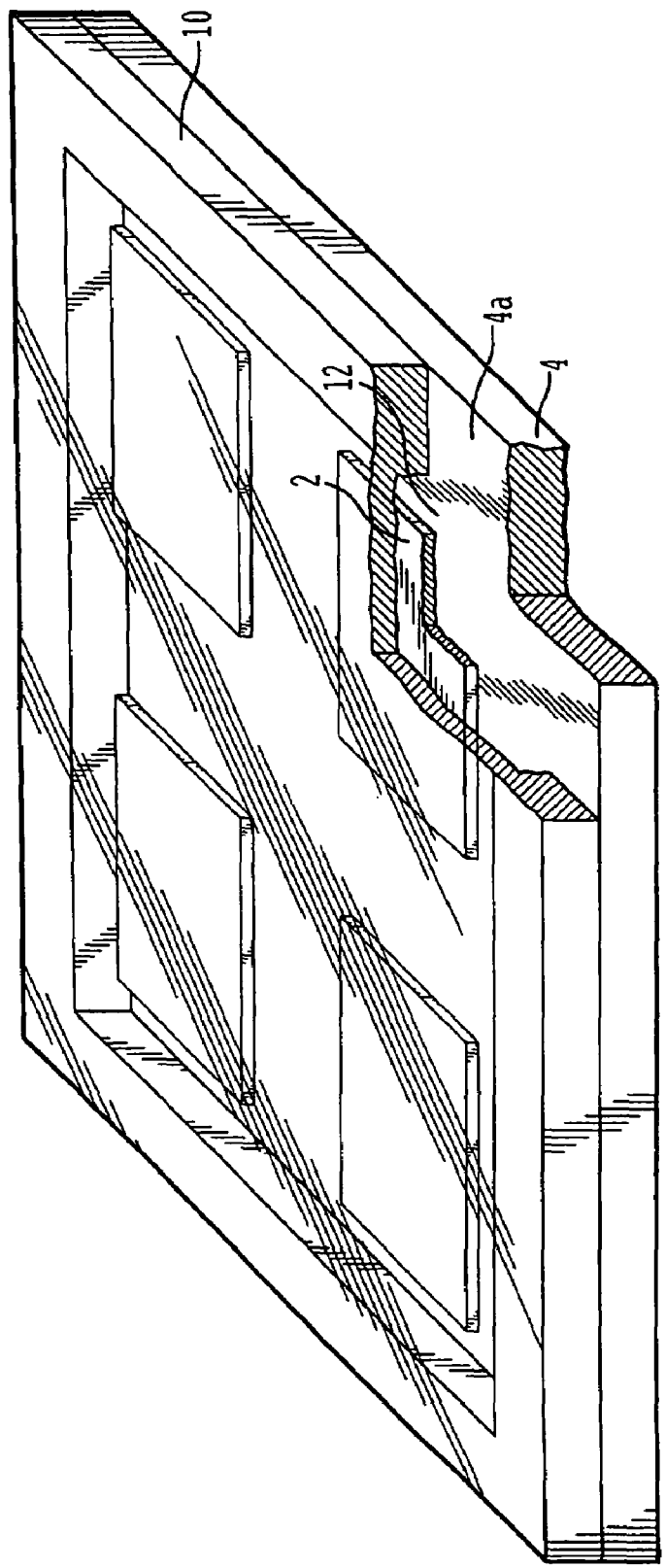
FIG. 2B is a schematic depicting another set of encapsulated convex devices, according to the present invention, sealed by an encapsulating member interposer which compartmentalizes multiple devices.

FIG. 2A is a schematic depicting another set of encapsulated convex devices, according to the present invention, sealed by an encapsulating member having a relief for clearance from the encapsulated device. FIG. 2B is a schematic depicting yet another set of encapsulated convex devices, according to the present invention, sealed by an encapsulating member which compartmentalizes multiple devices. FIGS. 2A and 2B differ from the embodiments illustrated in FIGS. 1A and 1B in that the encapsulating member (i.e. the cover 10) shown in FIGS. 2A and 2B includes relief area(s) 12 such that an interposer 6 is not necessary. The relief area(s) 12 as discussed below are formed with a sufficient depth to provide the clearance formerly provided by the interposer. As such only a singular bonding step needs to be performed in order to hermetically encapsulate the devices 2. However, in FIGS. 2A and 2B, the encapsulating member (i.e. the cover 10) is more detailed and requires more extensive fabrication than the fabrication of cover 8 in FIGS. 1A and 1B.

Figure 3A:
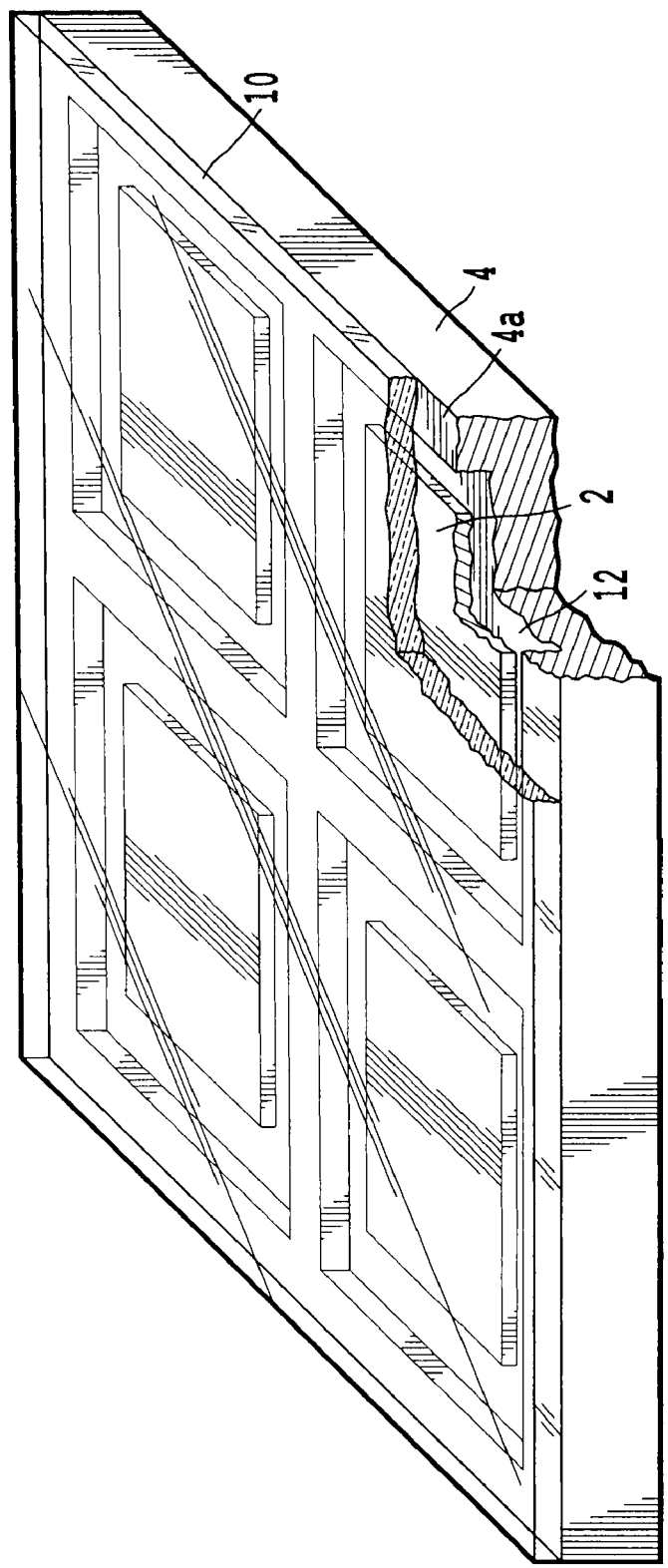
FIG. 3A is a schematic depicting a set of encapsulated concave devices, according to the present invention, sealed and compartmentalized by an encapsulating member.
Figure 3B:
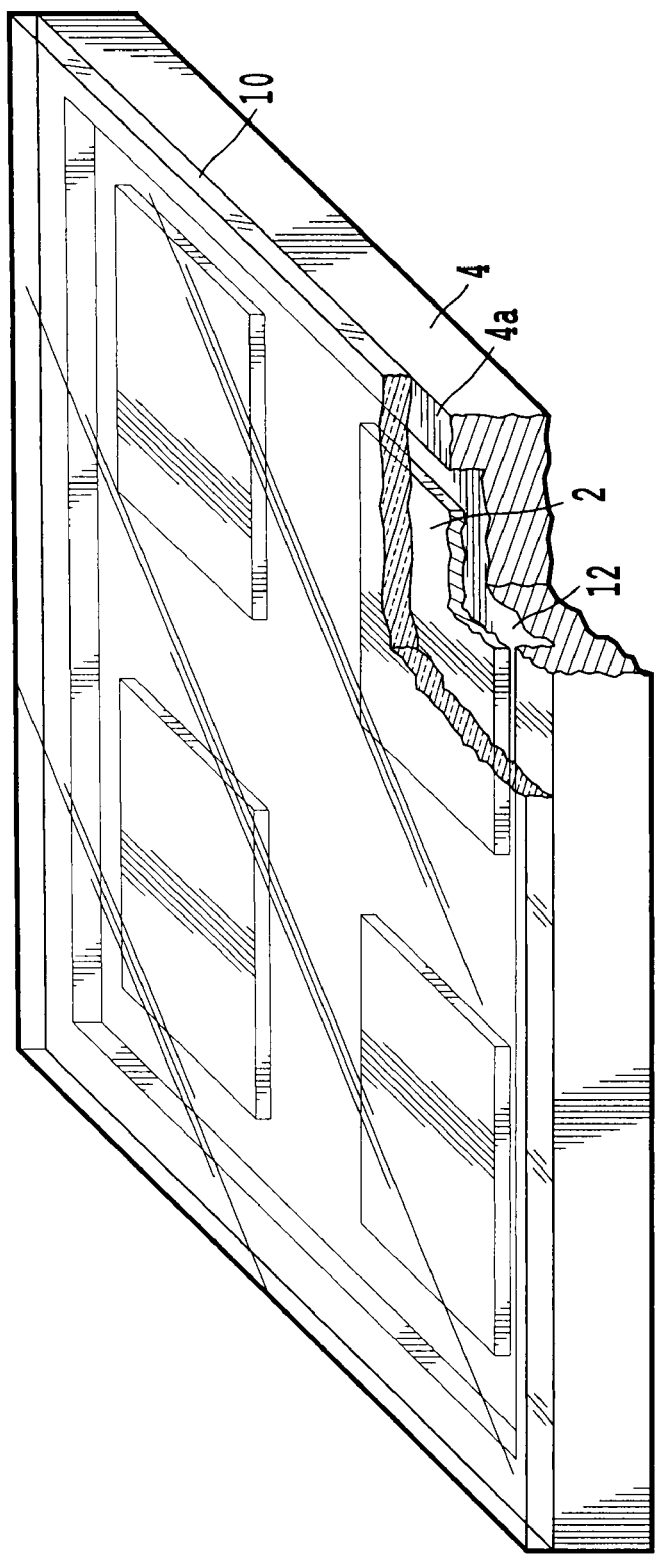
FIG. 3B is a schematic depicting another set encapsulated set of concave devices, according to the present invention, sealed by an encapsulating member.

In FIG. 2A, the cover 10 has a plurality of relief areas 12. Bonding cover 10 to carrier 4 provides compartmentalization of individual devices 2. In FIG. 2B, the cover 10 has a singular relief area 12 which upon bonding hermetically encapsulates a plurality of devices 2 within the singular relief area 12. The relief areas 12 in FIGS. 2A and 2B can be formed by removing material from the encapsulating member in the vicinity where the convex device will be, or by adding material to the encapsulating member in the vicinity where the bonding will occur. For example, cover 8 may be made of silicon and the relief pattern is etched using standard etching (such as a plasma etch) and lithography processes. Cover 8 may also be formed by depositing oxide on a silicon piece, and etching the oxide to form the relief pattern, or selectively forming the oxide on the silicon piece. FIG. 3A is a schematic depicting a set of encapsulated concave devices, according to the present invention, sealed and compartmentalized by an encapsulating member. FIG. 3B is a schematic depicting another set encapsulated set of concave devices, according to the present invention, sealed by an encapsulating member. Concave devices 14 are formed such that the devices 14 are recessed and do not extend above a major surface of the electronic chip 4. Correspondingly, there is no need to provide an encapsulating member such as cover 10 with relief areas 12 or to provide an interposer 6. As shown in FIGS. 3A and 3B, cover 8 bonds to surfaces of the device carrier 4 around the devices 2. Design of the device carrier 4 permits compartmentalization of the individual devices 2 if necessary for the proper functioning of the devices or for the robustness of the encapsulation. FIG. 3B illustrates the encapsulation of several recessed devices 14 without compartmentalization. In this example of the present invention, bonding on the outside perimeter surfaces of the electronic chip provides the hermetic encapsulation of all devices 14 inside that perimeter.

In the structures shown in FIGS. 3A and 3B, the surface of the carrier 4 and the bottom surface of cover 10 are prepared according to the above-described mechanical and chemical specifications. The bottom surface of cover 10 and the surface of carrier 4 are brought into direct contact and bonded to form the hermetic seal.

The cover 8 may also be bonded to the surface of the device carrier 4 interior to the devices 2 relative to the bonding around the devices. This interior bonding may be desirable to facilitate making an electrical through connection through the encapsulating member without adversely affecting the encapsulation and/or to provide additional mechanical support to the device carrier beyond that provided by bonding around the devices. How interior bonding can facilitate making an electrical through connection through the encapsulating member will be discussed below.

According to the present invention, surfaces of a device carrier and a surface of a suitable encapsulating member, such as for example the cover 10, are prepared for low temperature non-adhesive direct bonding. The surface preparation typically includes surface planarization and polishing to achieve the acceptable mechanical specification of planarity and smoothness, and chemical treatment. One suitable encapsulating member (e.g., cover 8) can be, for example, a silicon wafer. Preparation of the silicon wafer for low temperature direct non-adhesive bonding is straightforward since a silicon wafer has no superstructures and the silicon wafer can be polished to a surface roughness of about 5 Å and a planarity of 0.1 μm over a 100 μm range and then easily chemically treated for surface activation. Preparation for encapsulation of a concave device is complicated by the concave device components which are thin and susceptible to damage. For example, even cleaning of a concave MEMS wafer after polishing must accommodate the sensitivity of the MEMS device components. The preparation of the concave device wafer can include planarization (if necessary), polishing, and chemical treatment, provided that measures are taken to protect the device (see below). For sensitive concave devices, the devices can be protected, according to the present invention, by a protective (i.e. sacrificial) layer applied to a part of the device wafer during some or all of the surface preparation process and which is subsequently removed prior to bonding. For example in preparing a concave MEMS device carrier for bonding, a photoresist layer can be spun on a concave MEMS device wafer, and subsequently removed from the wafer surface, leaving a photoresist layer in the concave regions of the MEMS devices thus protecting the MEMS device components encapsulated in the photoresist during preparation for bonding. After bonding preparation, this protective photoresist layer can be removed without damaging the prepared bonding surface.

Figure 6:
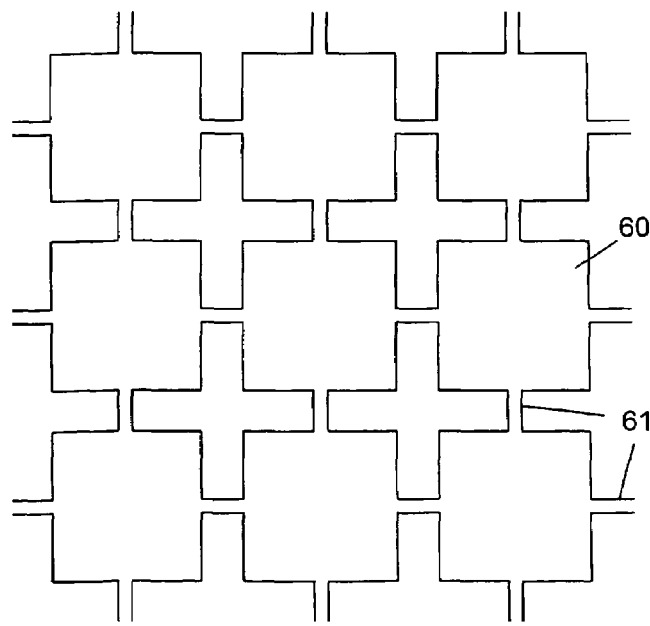
FIG. 6 is a section diagram of a mask used in the surface activation processing.

A dry chemical treatment, such as exposure to plasma after polishing activates the bonding surfaces. A shadow mask may be employed to mask the MEMS device areas while exposing the areas on the carrier 4 requiring activation. The MEMS wafer may be placed in a metal fixture having a mask with a matrix of metal areas corresponding to the pattern of the MEMS devices. A section of such a mask is shown in FIG. 6. This fixture has a matrix of metal squares 60 interconnected by elements 61. Other shapes or arrangements, as appropriate for the particular MEMS device, may be used. The directionality of the dry treatment and/or the width of the elements 61 are selected so that the areas 4a on the carrier 4 are adequately exposed to the plasma treatment for proper surface activation, to ensure complete and secure bonding. For convex devices which have surface components which extend beyond the device carrier surface, protection of the components of the devices becomes more paramount. As shown in FIGS. 1A-2B, the encapsulating member(s) must provide relief. In the case of using an interposer, a double bond structure can hermetically encapsulate a set of convex devices. A double bonding process can include 1) a single bonding step which bonds three elements (e.g., a device carrier wafer, an interposer and a cover) having four bonding surfaces between the three elements, prepared and bonded to form two bonded interfaces. Alternatively, the double bonding process can include two sequential bonding steps including a step of preparing two bonding surfaces (e.g. a surface of the cover and a surface of the interposer) for non-adhesive bonding and subsequently bonding those prepared surfaces to form a bonded pair, followed by a subsequent step of preparing a surface of the bonded pair and a surface of the device carrier wafer for direct non-adhesive bonding and subsequently bonding the device carrier wafer to the bonded pair.

Figure 4:
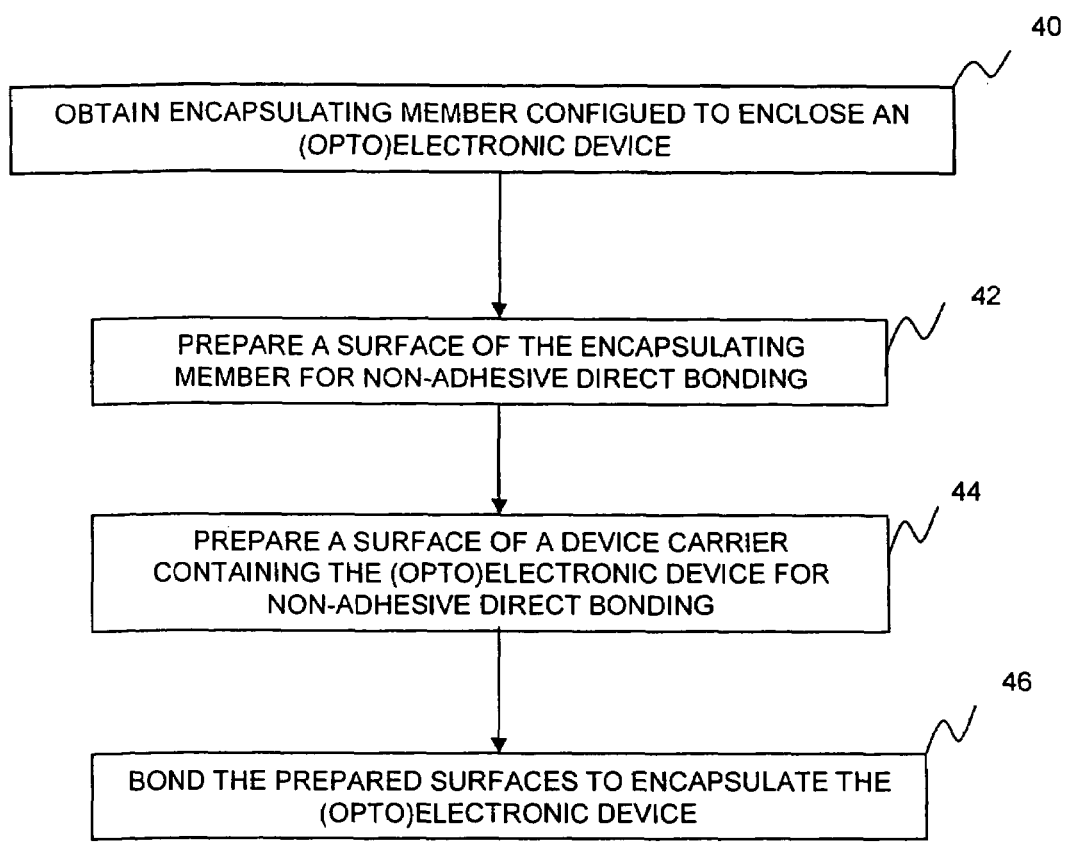
FIG. 4 is a flow chart illustrating the steps in a method of the present invention.

FIG. 4A is a flow chart illustrating generally the steps in a method of the present invention. As illustrated in FIG. 4, the method for packaging an electronic device includes in step 40 obtaining an encapsulating member configured to enclose the electronic device. In step 42, a surface of the encapsulating member is prepared for non-adhesive direct bonding. In step 44, a surface of a device carrier including the electronic device is prepared for non-adhesive direct bonding. In step 46, the prepared surface of the encapsulating member is bonded at low temperature (i.e. at or near room temperature) to the prepared surface of the device carrier to form an encapsulation of the electronic device. The devices encapsulated can be hermetically encapsulated, and the devices encapsulated can include at least one of an optoelectronic device, a micro-electrical mechanical systems MEMS device, and a radio frequency device, for example.

In step 40, the relief in the encapsulating member is formed with a determined depth necessary to provide clearance from the electronic device. The relief formation is made by patterning the encapsulating member with a pattern of the periphery of the electronic device and etching the encapsulating member to the determined depth.

Alternatively, in step 40, the relief in the encapsulating member is formed by preparing a surface of an interposer having at least one through hole for non-adhesive bonding, preparing a surface of a cover for non-adhesive bonding, and bonding the prepared surfaces of the interposer and the cover to form a bonded pair such that the through hole forms the relief in the encapsulating member. In preparing the surface of the interposer, the interposer can be patterned with a pattern of the relief needed to clear the devices to be encapsulated and then etched to form the through hole(s). Further, the surface of the bonded pair can be bonded to the prepared portion of the surface of the device layer such that the through hole is proximate to the electronic chip device and forms the relief in the encapsulating member. Moreover, the surface of the interposer is processed (i.e. by grinding, chemical mechanical polishing, and/or etching) to a determined thickness to provide the requisite clearance.

In step 44, the surface of the encapsulating member and a portion of the surface of the device carrier are prepared for direct non-adhesive bonding. The prepared surfaces preferably have a surface roughness of less than 0.5 nm and a planarity of less than 0.1 µm over a 100 µm range. This mechanical specification can be obtained by polishing the bulk material comprising the encapsulating member, for example, silicon, glass, quartz, etc. or by forming a dielectric on the surfaces of either or both of these elements and then polishing the dielectric the required surface roughness and planarity if necessary. The dielectric can be a silicon oxide film formed by depositing a silicon dioxide film or thermally growing the silicon dioxide film. Moreover, the dielectric can be any one of or a combination of a silicon oxide, a silicon nitride, a spin-on glass, and a dielectric polymer. These dielectrics are preferably formed and/or finished with the requisite surface smoothness and planarity to enable non-adhesive direct bonding.

After polishing the surface is cleaned and dried to remove any residue from the polishing step. The polished surface is preferably then rinsed with a solution. The bonding surface may also be etched prior to polishing to improve the planarity and/or surface roughness. The etching can be effective to remove high spots on the bonding surface by selective etching of the high spots using, for example, standard photolithographic techniques. For example, a layer of silicon nitride can be embedded within a silicon dioxide layer that can serve as an etch stop when using a solution containing HF. The etch stop material may be used to improve uniformity, reproducibility, and manufacturability.

In step 44, the prepared surfaces are preferably activated to enhance the bonding occurring at step 46. The activation process can include a very slight wet or dry chemical (i.e. plasma) etch, to be discussed in more detail below. The activation process can include forming from a wet solution surface species on the prepared surfaces including for example at least one of a silanol group, an $NH_2$ group, a fluorine group, and an HF group. The activation process can include exposing the prepared surfaces to one of an oxygen, argon, $NH_3$ and $CF_4$ plasma process. The plasma process can be conducted in one of a reactive ion etch mode, inductively coupled plasma mode, and a sputtering mode. Regardless, the bonding groups formed on the surface are capable of forming chemical bonds between the encapsulating member and the device carrier at approximately room temperature. With appropriate bonding and activation, chemical bonds can be formed with a bond strength of at least 500 $mJ/m^2$, and more preferably at least 1000 $mJ/m^2$, and at least 2000 $mJ/m^2$.

The activation process to the MEMS device carrier is a typical semiconductor compatible process than can be either all wet, all dry, or a combination of wet and dry processes. The all dry version is especially useful for activating bonding surfaces of MEMS device carrier wafers to avoid any damage to the MEMS devices that may result from a wet process. Furthermore, the dry process can be applied selectively to only the bonding surfaces or to surfaces that do not include sensitive MEMS devices to avoid any damage that may be cause by an all dry process while allowing activation of the bonding surface. A mask such as shown in FIG. 6 may be used to selectively activate portions of the surface of the carrier wafer.

In step 46, the bonding occurs spontaneously upon contacting under room temperature conditions the prepared surface of the encapsulating member to the prepared portion of the surface of the device carrier to produce a non-adhesive bond between the wafer interpose and the device carrier. The non-adhesive bond can be annealed to form a stronger bond.

A more detailed description of one bonding process of the present invention is given below for illustrative purposes.

To bond an interposer to a cover, the interposer and cover are prepared with bonding surfaces in accordance with the present invention and are preferably in wafer form to reduce the manufacturing cost. However, either or both may be in die form if preferable. The cover is selected according to required cost and performance specifications. For example, the cover must be transparent, i.e. glass, if micromirror MEMS devices are being packaged to allow light of a particular wavelength or a range of wavelengths to be transmitted through the package. The cover could be a silicon transparent to IR and near IR radiation if the function of the enclosed device is to receive and/or transmit IR radiation. Alternatively, a material providing appropriate electromagnetic interference (EMI) shielding must be used as a cover, if a RF switch MEMS device is being packaged. In this case, the cover for example could be a silicon wafer patterned with a metallic grid to provide the afore-mentioned EMI shielding.

Similarly, the interposer is selected according to required cost and performance specifications. The interposer, as noted earlier, provides a relief of a desired dimension to protect the encapsulated convex devices. Relief patterning in the interposer is designed to provide adequate relief of the interposer surface such that, upon bonding, the interposer mates to the convex MEMS wafer (i.e. the electronic chip) in a region where the convex MEMS devices are not present. Less than 0.5 to 1 mm width of mating surface between the interposer and convex MEMS wafer is required with proper surface preparation of the interposer and convex MEMS wafer. The relief, according to the present invention, can extend through the entire interposer thickness or only through a portion of the interposer thickness. An interposer can be a silicon wafer. Silicon wafers have a number of advantages including: low cost, availability in a wide variety of thicknesses and diameters, a variety of established processing techniques are available for the formation of recesses or cavities having a wide variety of desired sizes and shapes, mechanical robustness, and the chemical suitability to the wafer bonding process of the present invention. It is furthermore, relatively easy to thin a silicon wafer with manufacturable techniques like grinding, lapping and/or polishing that may be preferable after bonding to minimize the thickness of the packaged MEMS device. A further advantage of using silicon for the interposer and/or cap is thermal expansion matching to a great many MEMS devices that are fabricated on silicon substrates. A still further advantage of using a silicon material for the interposer and/or cap is that active (opto)electronic devices may be fabricated in this material, facilitating the integration of these (opto) electronic devices with the MEMS devices.

Cavities may be formed in the interposer, according to the present invention, after bonding the interposer to the cover. The interposer thickness can also be thinned at this time, if desired. Alternatively, according to the present invention, the cavities can first be formed in the interposer, followed by bonding the interposer to the cover, and then followed by interposer thinning if desired. Another option, according to the present invention, the cavity can be formed in a suitably thick cover, obviating the need for an interposer and the first bonding step.

After the interposer and the cover are bonded, a second bonding step can be performed. The second bonding step includes preparing the convex MEMS wafer surface and the exposed interposer surface for bonding. It is not necessary to prepare the entire convex MEMS wafer surface for bonding, although it may reduce the manufacturing cost to be able to do so. It is only necessary to prepare the convex MEMS wafer surface in those surface areas (i.e. mating surfaces) where it is desired to form a direct bond. The MEMS wafer surface where the hermetic bond is formed is appropriately protected during fabrication of the MEMS wafer or suitably revealed, for example by removal of protective surface layer, at a point during fabrication of the MEMS wafer after which the surface roughness or planarity of the surface to be bonded will not be adversely affected.

According to the present invention, the surface preparation process steps (e.g., steps 42 and 44) for preparing the bonding surfaces include steps, such as for example, including planarization, polishing, surface activation, and surface passivation. Details of the surface preparation process have been described in the afore-referenced in U.S. Ser. No. 09/505,283. The bonding surfaces preferably have a roughness of about no more than about 1 nm and preferably no more than about 0.5 nm and should be substantially planar (i.e. a planarity of less than 0.1 µm over a 100 µm range). The surface roughness values are typically given as root-mean square (RMS) values. The bonding surface meeting the surface roughness criteria are preferably activated to enable a low temperature, direct, non-adhesive bond.

One example of an activation process of the present invention is the above noted very slight etch (VSE) process. The term VSE, as used herein, describes an etching process in which the root-mean-square micro-roughness (RMS) of the very slightly etched surface remains at approximately the unetched value, typically <0.5 nm and preferably in the range of 0.1 nm to 3 nm and more preferably less than 0.5 nm. The optimum amount of material removed depends upon the material and the method used for removal. Typical amounts removed vary from Angstroms to a few nanometers. It is also possible to remove more material, provided the surface roughness does not deteriorate beyond acceptable values for bonding. The VSE process, according to the present invention can break surface bonds on the treated surfaces and can occur without significant removal of material. The VSE process is distinct from a simple modification of the surface by, for example, charging the surface with electronic charge or damaging the surface layer.

The VSE process can consist of a gas or mixed gas (such as oxygen, argon, nitrogen, $CF_4$, $NH_3$) plasma process at a specified power level for a specified time. The plasma process may be conducted in different modes of plasma operation. Both reactive ion etch (RIE) and plasma modes such as for example an inductively-coupled plasma mode (ICP) can be used. Plasma sputtering can also be used.

The VSE process etches the surface very slightly via physical sputtering and/or chemical reaction and preferably is controlled to not degrade the surface roughness of the bonding surfaces. The surface roughness may even be improved depending upon the VSE process and the material(s) etched. Almost any gas or gas mixture that will not etch the bonding surface excessively can be used for activation and subsequent room temperature bonding. The VSE process serves to clean the surface and break bonds of the oxide on the wafer surface. The VSE process significantly enhances surface activation. A desired bonding species can be terminated on the bonding surface during the VSE process. Alternatively, a post-VSE treatment that terminates the surface with a desired terminating species during the post-VSE process may be used.

The desired species further preferably forms a temporary bond to the bonding surface atomic layer, effectively terminating the atomic layer, until a subsequent time that the bonding surface can be brought together with another activated bonding surface.

A post-VSE process may consist of immersion in a solution containing a selected chemical to generate surface reactions that result in terminating the bonding surface with a desired species. The immersion is preferably performed immediately after the VSE process. The post-VSE process may be performed in the same apparatus in which the VSE process is conducted. This is done most readily if both VSE and post-VSE processes are either dry, i.e, plasma, RIE, ICP, sputtering, etc, or wet, i.e., solution immersion. A desired species preferably consists of a monolayer or a few monolayers of atoms or molecules.

The post-VSE process may also consist of a plasma, RIE, or other dry process whereby appropriate gas chemistries are introduced to result in termination of the surface with the desired species. The post-VSE process may also be a second VSE process. The termination process may also include a cleaning process where surface contaminants are removed without VSE.

A more specific example is provided below. PECVD $SiO_2$ is deposited on a Si wafer, and then treated in a plasma (such as argon, oxygen or $CF_4$). The surface of the PECVD oxide, after the plasma treatment, is mainly terminated by Si—OH groups due to the availability of moisture in the plasma system and in air. After the plasma treatment, the wafers are immediately immersed in solution such as ammonium hydroxide (NH$_4$OH), NH$_4$F or HF for a period such as between 10 and 120 seconds. After immersing the wafers in the NH$_4$OH solution, many Si—OH groups are replaced by Si—NH2 groups according to the following substitution reaction:

2Si—OH+2NH4OH 2Si—NH2+4HOH

Alternatively, many Si—F groups are terminating on the PECVD SiO$_2$ surface after an NH$_4$F or HF immersion.

The hydrogen bonded Si—NH2:Si—OH groups or Si—NH2:Si—NH2 groups across the bonding surfaces can polymerize at room temperature in forming Si—O—Si or Si—N—N—Si (or Si—N—Si) covalent bonds:

Si—NH2+Si—OH Si—O—Si+NH3

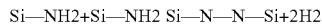
Si—NH2+Si—NH2 Si—N—N—Si+2H2

Alternatively, the HF or NH$_4$F dipped oxide surfaces are terminated by Si—F groups in addition to Si—OH groups. Since HF or NH$_4$F solution etches silicon oxide strongly, their concentrations must be controlled to an adequately low level, and the immersion time must be sufficiently short. This is an example of a post-VSE process being a second VSE process. The covalent bonds across the bonding interface are formed due to the polymerization reaction between hydrogen bonded Si—HF or Si—OH groups:

Si—HF+Si—HF Si—F—F—Si+H2

Si—F+Si—OH Si—O—Si+HF When two activated bonding surfaces contact each other, a spontaneous bond typically occurs at some location in the bonding interface and propagates across along the bonding surface. As the initial bond begins to propagate, a chemical bonding reaction such as polymerization that results in the formation of chemical bonds across the two bonding surfaces takes place between species used to terminate surfaces when the surfaces are in sufficient proximity. The by-products of the bonding reaction diffuse away from the bonding interface to the wafer edge or are absorbed by the wafers, typically in the surrounding materials. The by-products may also be converted to other by-products that diffuse away or are absorbed by the wafers. The degree of covalent and/or ionic bonding may be increased by removal of converted species resulting in a further increase in bond strength. There is preferably an open structure at and/or near the bonding surface so that the by-products of the above-described polymerization reaction can be easily removed. An example of an open structure is one that has been bombarded with a dry etch process or ion implantation to create subsurface damage. The bonded surfaces are preferably stored for a specified period of time at ambient or at low or room temperature after bonding to allow removal of species or a conversion of the species. The storage time is dependent upon the type of plasma process used. Chemical bonds may be obtained more quickly, in a matter of minutes, when for example plasma processes such as an Ar plasma treatment is used. For example, bonds with a strength of 585 mJ/m$^2$ can be typically obtained immediately after bonding, and bonds with a strength of over 800 mJ/m$^2$ can be typically obtained after 8 hours for deposited oxides etched by an Ar plasma followed by an NH$_4$OH dip. Annealing the bonded wafers during bonding can increase the bond strength. Storing the bonded wafers under vacuum can be used to facilitate the removal of residual gasses from the bonding surfaces.

All of the activation and bonding processes noted above can be carried out at or near room temperature. Bonding energies of approximately 500-2000 mJ/m$^2$ or more can be achieved by the activation processes described above.

However, the above-noted preparation process, without precaution, may present problems for the encapsulation of convex devices due to the fact that convex portions of the devices extend above the wafer surface and can be damaged by either the planarization or the polishing processes.

Thus, according to the present invention, the inclusion of planarization and polishing for the surface preparation of convex device carriers is not preferred. Instead, surface activation and passivation for the preparation of bonding of the convex device carriers is modified, as required, not to damage the convex devices while still achieving the desired function of surface activation and preparation to achieve a successful hermetic bond.

Planarization of convex MEMS wafer surfaces, for example, as part of the surface preparation process immediately prior to bonding, is avoided, according to the present invention, by designing the fabrication step of the MEMS device carriers such that hermetic bonding regions between MEMS devices on the device carrier have a suitable mechanical specification for non-adhesive direct bonding.

For example, MEMS device wafers are typically fabricated using a series of photolithographic masking and processing steps. The masking levels define the lateral extent of MEMS die that constitute the wafer. The die extent typically includes allowance for separation between adjacent die and other packaging considerations. In the present invention, the allowance for separation between adjacent die is made sufficient to accommodate a region where a hermetic encapsulation bond can be formed and remain after die singulation. The width of the accommodating region is typically less than a millimeter (mm). An area on the wafer, between the die, is thus delineated where a hermetic encapsulation bond will be formed after completion of the convex MEMS wafer. The bonding region is also a region used to define the recess in the interposer shown in FIG. 3A, thereby providing an allowance for wafer alignment during the bonding process.

For example in bonding to convex MEMS device wafers, a more accurate alignment of the wafers during the bonding compared to single wafer bonding of concave MEMS devices is typically required to accommodate an alignment tolerance to the bonding region discussed above.

The surface of the region to be bonded on the MEMS wafer is taken into consideration in the design of the MEMS photolithographic masking and processing steps. Thus, for MEMS encapsulation according to the present invention, the MEMS fabrication process must ensure that the surface of the bonding region is protected throughout the processing such that planarization and polishing as part of the wafer bonding surface preparation process is not required after fabrication of the MEMS devices.

Such measures can be accomplished in a number of ways. For example, according to the present invention, MEMS device wafer processing typically starts with blank silicon wafers. These starting wafers are evaluated for planarization and roughness. If the planarization and roughness of the starting material are inadequate for non-adhesive direct bonding, the wafers are first polished or planarized and polished as required to meet the required mechanical specification. This mechanical specification, as previously noted, is a surface roughness of preferably less than about 5-10 Å and a surface planarity of less than 0.1 μm over a 100 μm range. This can be achieved by polishing of the blank silicon wafer, or, alternatively, by forming a dielectric such as for example silicon dioxide or silicon nitride on the surface followed by chemo-mechanical polishing. If the starting wafers meet the required mechanical specification, no additional planarization and/or polishing is required.

According to the present invention, the mechanical specification standard can be satisfied on either a semiconductor surface or a surface of a dielectric coating. An example of a suitable surface with an oxide coating is a thermally oxidized silicon wafer. Either silicon-to-silicon, dielectric-to-dielectric, or silicon-to-dielectric combinations having the above-noted planarity and smoothness can be used according to the present invention. Either hydrophobic or hydrophilic wafer bonding chemistries can be used, according to the present invention.

After the required mechanical specification of the delineated bonding regions has been verified or met, it is suitably protected throughout the MEMS fabrication process so that only surface activation and passivation of the delineated region between MEMS devices will be required to obtain a hermetic bond after the MEMS fabrication process is complete.

The protection/restoration of the delineated region is accomplished in a variety of ways categorized in general by damage removable (i.e. restoration) or by damage prevention approaches.

In the damage removable approach, a sacrificial layer is first formed on the hermetic bonding region. The sacrificial layer is chosen such that 1) the sacrificial layer can be formed on the delineated bonding regions without compromising the mechanical specification of the hermetic bonding region, 2) the sacrificial layer can withstand all of the processing steps to which this region is exposed to during fabrication of the MEMS devices, and 3) the sacrificial layer is removable from the hermetic bonding region without compromising the mechanical specification of the hermetic bonding region.

The bonding surfaces may be selectively oxidized by, for example, a shadow mask technique or a lift-off technique. The lift off technique may consist of depositing a photoresist, etching and undercutting openings where the oxide is to be formed, depositing the oxide and then lifting off the oxide in the other areas, which is discussed below.

One example of a sacrificial layer that typically meets these requirements is a silicon oxide layer on silicon. In this example, a thermal silicon oxide or plasma enhanced chemical vapor deposition (PECVD) silicon oxide is formed on a silicon MEMS device within the hermetic bonding region. The silicon oxide surface is then removed after the MEMS fabrication is complete, leaving a silicon surface with a suitable mechanical specification. Any damage to the silicon oxide layer is subsequently removed by removal of the silicon oxide layer. Removal of the silicon oxide is typically a selective removal. Alternatively, the silicon oxide can be removed before the MEMS fabrication is complete as long as suitable damage is avoided to the delineated bonding regions.

In the damage prevention approach, the surface of the delineated bonding regions is not allowed to degrade below the required mechanical specification throughout the MEMS fabrication process. Such avoidance requires evaluating each process step of the MEMS fabrication process and verifying that each step does not significantly degrade the mechanical specification of the surface. If a particular process step degrades the surface quality, the surface exposed to that particular process step must be masked during that particular step or the corrupting process step modified.

The present invention uses either the surface of the device carrier as the bonding surface or a coating (e.g., the above-noted silicon oxide layer) on the surface of the device carrier as the bonding surface. With appropriate protection of the delineated bonding surface regions, post planarization and/or polishing of the convex device carrier after fabrication of the devices on the device carrier can be avoided.

The chemical process specification that results in surface activation and passivation may also be modified to not damage the delineated bonding regions on the device carrier while still achieving the desired function of surface activation and preparation for hermetic bonding. The modification required depends in detail on the specific nature of the devices being encapsulated. One typical modification might replace wet components of the chemical process with analogous dry process, resulting in a chemical process utilizing only dry processing components. For example, an aqueous ammonium hydroxide treatment can be replaced with a reactive ion etch using ammonium hydroxide balanced with argon as a source gas.

Figure 5:
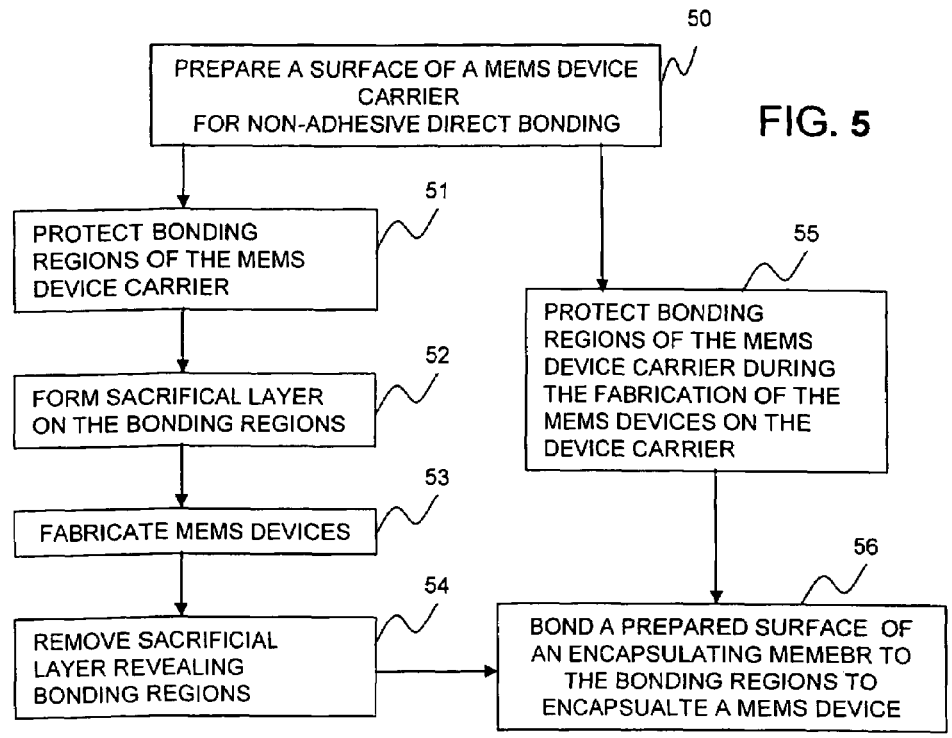
FIG. 5 is a flow chart illustrating the steps in a method of the present invention to protect surface regions of a micro-electrical mechanical systems MEMS device.

FIG. 5 illustrates an example of protecting surfaces of a device carrier. FIG. 5 is a flowchart showing two process paths for protecting MEMS device carriers. In step 50, a surface of a micro-electrical mechanical systems MEMS device carrier is prepared for non-adhesive direct bonding. In step 51, the bonding regions are protected during fabrication of the MEMS devices such that the bonding regions maintain the above-mentioned appropriate surface characteristics for the non-adhesive direct bonding. In step 52, a sacrificial layer is formed on the bonding regions. The sacrificial layer can be at least one of a silicon oxide, a silicon nitride, a spin-on glass, and a dielectric polymer. The MEMS device is fabricated in step 53, and the sacrificial layer is removed in step 54, revealing the bonding regions. If needed, activation of the bonding regions may be performed at this point. The sacrificial layer may be removed after the MEMS fabrication, or at some point during the MEMS fabrication such that the remaining step(s) to which the bonding regions are exposed does(do) not degrade or significantly degrade the surface characteristics.

Alternatively, as shown in step 55, protection of the bonding regions can occur according to the present invention by appropriate design rules determining the fabrication procedures of the MEMS devices such that steps in the fabrication procedures of the MEMS devices maintain integrity of the surface of the carrier in the bonding regions for non-adhesive direct bonding. Regardless of the method of protection, in step 56, the bonding regions are bonded to the surfaces of the encapsulating member to encapsulate the enclosed MEMS devices.

EXAMPLES

Figure 7A:
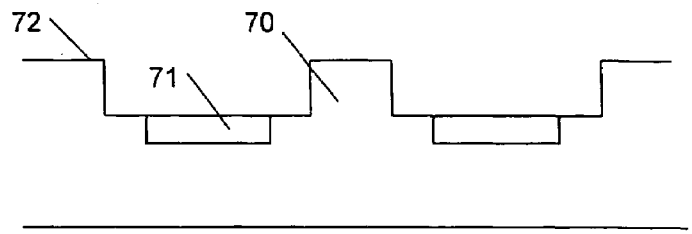
FIGS. 7A-7D are drawings illustrating an example of the bonding a cover to a MEMS carrier according to the invention.
Figure 7B:
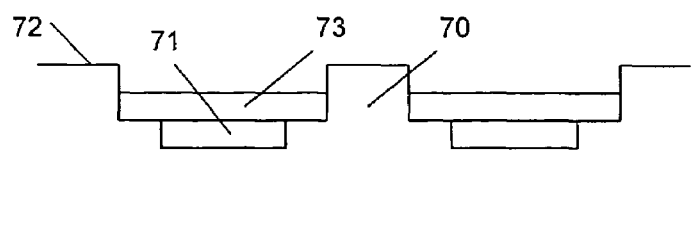
Figure 7C:
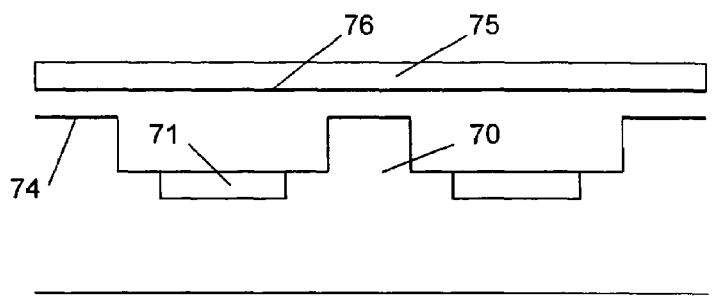
Figure 7D:
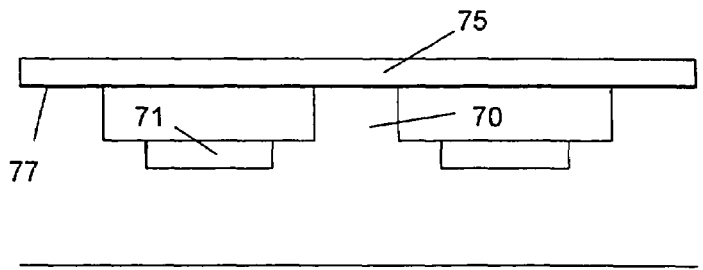

A concave MEMS device 71 is formed on a silicon device carrier 70 (FIG. 7A). Device carrier 70 has upper surface 72 surrounding each MEMS device 71; It is noted that the relative sizes of MEMS device 71 and the structure of carrier 70 are not drawn to scale, but have been drawn merely to illustrate the principals of the invention. A removable photoresist layer 73 is formed over MEMS device 71, as shown in FIG. 7B. Layer 73 protects MEMS device 71 while not affecting the structure or operation of the MEMS device in any significant way after its removal. An example of layer 73 is photoresist. Subsequently, surface 72 is prepared for direct, non-adhesive room-temperature bonding by the method described above, namely, polishing to a surface roughness of preferably less than 0.5 nm followed by an activation process. The surface prepared for bonding is illustrated by the darker line 74 in FIG. 7C. Also shown in FIG. 7C is cover 75, which could also be a silicon layer having a lower surface 76 prepared for bonding in a similar manner to surface 72. Layer 73 is removed (also shown in FIG. 7C) and cover 75 is bonded to carrier 70 by bringing into direct contact surfaces 72 and 76. A bond 77 forms between surface 76 of cover 75 and surface 72 of carrier 70. The bonding is allowed to propagate at room temperature to form a chemical bond.

Figure 8A:
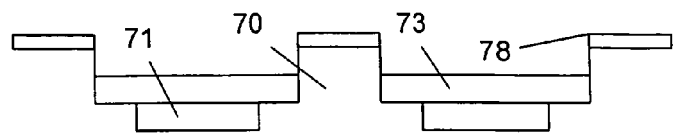
FIGS. 8A-8E are drawings illustrating an example of bonding a cover to a MEMS carrier according to the invention.
Figure 8B:
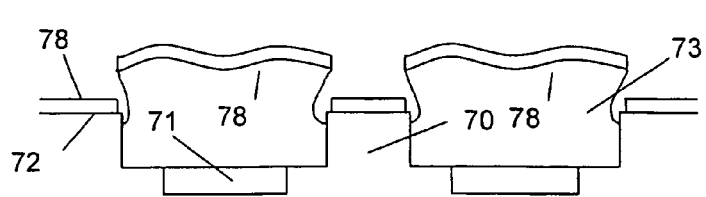
Figure 8C:
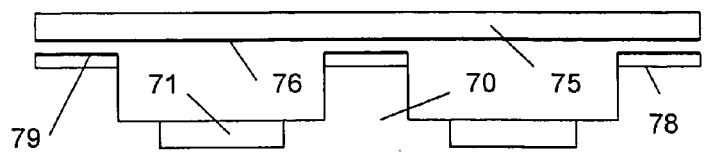
Figure 8D:
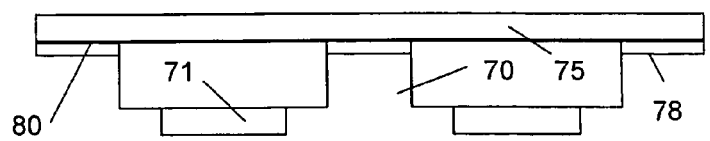

A second example is shown in FIGS. 8A-8D. As in the example shown in FIGS. 7A-7D, a concave MEMS device having a silicon device carrier 70, MEMS 71 and upper surface 72 are prepared. Subsequently, as shown in FIG. 8A, an oxide layer 78 is selectively formed on surface 72 of device carrier 70. The selective oxide layer could be low-temperature oxide, such as a sputtered or e-beam evaporated silicon oxide or aluminum oxide layer deposited with selectivity determined by a shadow mask. A selective insulating layer may also be formed by ion implantation of oxygen, nitrogen, etc. into the carrier surface. Photoresist 73 may be formed over the MEMS to protect the MEMS from any needed polishing or activation process. The selective oxide layer is patterned using an undercut photoresist layer followed by liftoff. The liftoff process is shown in FIG. 8B, where a photoresist layer 73 is formed over MEMS device 71, etched to expose surfaces 72 and undercut, followed by deposition of layer 78. Referring to FIG. 8C, the surface of oxide layer 78 is prepared for bonding as discussed above, after formation of a protective removable layer 73, and a silicon cover 75 having a surface prepared for bonding 76 is also prepared. Surface 76 of cover 75 is bonded to surface 79 of carrier 70, as illustrated in FIG. 8D, to form bond 80. Removable layer 73 is also removed after the process of preparing the surface of oxide 78. Oxide 78 may only require activation if suitable surface roughness and planarity may be achieved through forming oxide 78.

Figure 8E:
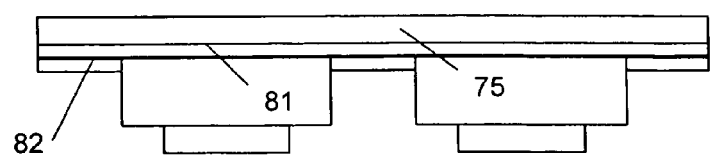

A modification of the second example is shown in FIG. 8E, where silicon cover 75 has oxide layer 81. Layer 81 may be formed by thermal oxidation, CVD, sputtering, or PECVD, for example. In this case there is no thermal cycle problem if cover 75 is simply a silicon cover. Oxide layer 81 has its surface prepared as discussed above, and is bonded to the upper surface of oxide film 78 to form bond 82. Again, oxide 81 may only require activation if suitable surface roughness and planarity may be achieved through forming oxide 81.

Another example where a convex MEMS is hermetically sealed according to the invention is illustrated in FIGS. 9A-9D. A device carrier 90, such as a silicon wafer, has an upper surface 92 prepared for bonding as discussed above, including polishing to a desired surface roughness and activation. Only activation may be required if cover 90 already has suitable surface roughness and planarity. A protective layer 91 is formed on selected regions 93 where bonding of the cover will later occur. Film 91 is selected such that its formation and removal will not degrade the surface roughness of surface 92. Examples of film 91 are deposited silicon dioxide and silicon nitride films, as mentioned above.

Figure 9A:
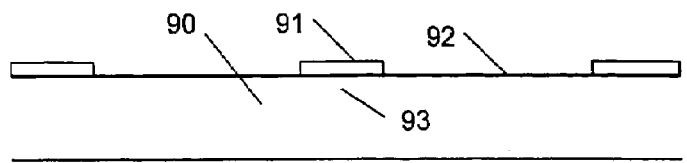
FIGS. 9A-9E are drawings illustrating an example of bonding a cover to a MEMS carrier according to the invention.
Figure 9B:
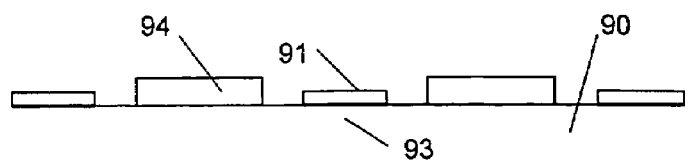

Subsequently, as shown in FIG. 9B, a MEMS device 94 is formed in areas surrounded by films 91. In FIG. 9B the surface characteristics of carrier 90 under films 91 (regions 93), is maintained while the surfaces exposed during the formation of the MEMS device 94 are likely degraded during the fabrication sequence of MEMS 94 and no longer suitable for bonding. Film 91 is removed and the surface of carrier 90 in regions 93, if required, is activated using a dry process such as a plasma or VSE etch. The effect is illustrated in the lower half of FIG. 9C were the surface of carrier 90 in regions 93 is shown with a darker line.

MEMS devices 94 may be adversely affected by the activation process, and should be protected during the activation process. One method of protection is to place the wafer in a fixture with a mask to protect MEMS devices 94. A section of an example of such as mask is shown in FIG. 6. Elements 60 of the mask are joined by elements 61. Elements 60 are placed over the MEMS devices and a directional dry activation process, such as an RIE process is used. The activation process preferably activates the areas under elements 61 to ensure a complete hermetic seal. Making the elements 61 as narrow as possible and decreasing the anisotropy of the activation process may be used. Also the mask may be moved relative to the carrier so that all of the areas 93 of the carrier are activated, while protecting MEMS device 94.

Figure 9C:
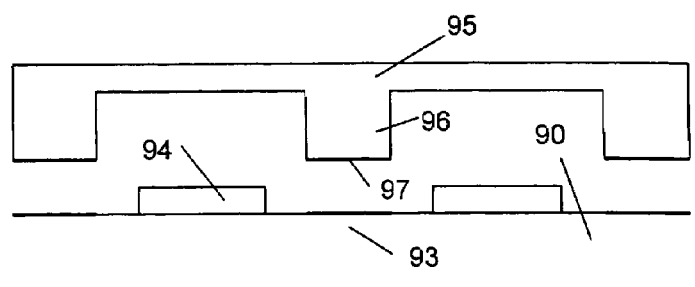
Figure 9D:
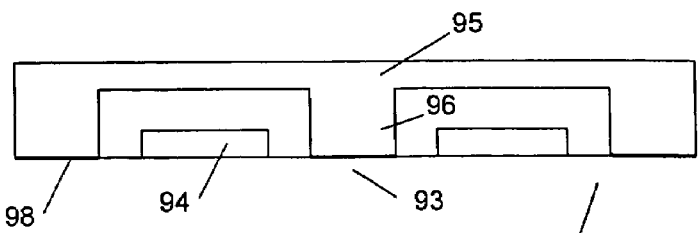

Also illustrated in FIG. 9C is a cover 95 having portions 96 designed to be bonded to the surface of carrier 90 in regions 93. Although portions 96 are shown as the same size as regions 93, this is not required. As mentioned above, only about a 0.5 to 1 mm wide region 93 is required to provide a secure, hermetic seal. Also, is again noted that the relative proportions of the regions 93, carrier 90 and the size of MEMS device 94 are not drawn to scale, but have been drawn merely to illustrate the principals of the invention. Portions 96 have a surface 97 prepared for bonding as discussed above, including polishing to a desired surface roughness and/or surface activation. Surfaces 97 are brought into direct contact with surfaces in regions 93, and bonded to form bond 98, as shown in FIG. 9D.

Figure 9E:
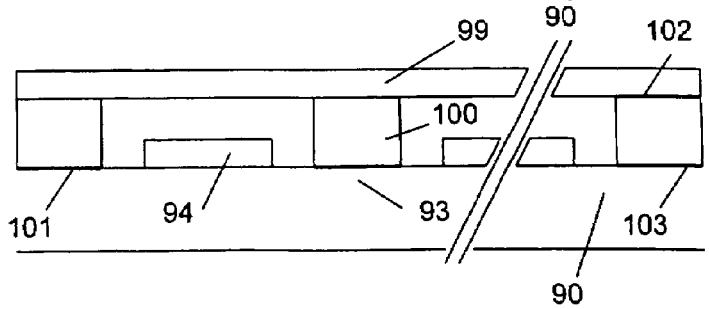

FIG. 9E illustrates two modifications of the example of FIGS. 9A-9D where the cover is a two-piece element comprised of plate 99 and elements 100. Examples of the cover are a silicon or glass plate 99 with either silicon or oxide elements 100. Oxide elements 100 may be formed by oxide deposition or growth over an area on plate 99 larger than that shown covered by elements 100, followed by removal of oxide material, for example with photolithographic patterning and oxide etching, to form elements 100. The surfaces of elements 100 are prepared as discussed above, and are brought into direct contact with the prepared surfaces of carrier 90 to form bond 101. Elements 100 may also be bonded to plate 99 and the so formed cover then bonded to carrier 90. Alternatively, element 100 may be separately formed, its upper an lower surfaces prepared for bonding, and element 100, plate 99 and carrier 90 bonded in one bonding operation. This is illustrated in the right-hand section of FIG. 9E where element 100 forms bond 102 to plate 99 and bond 103 with carrier 90.

Figure 10A:
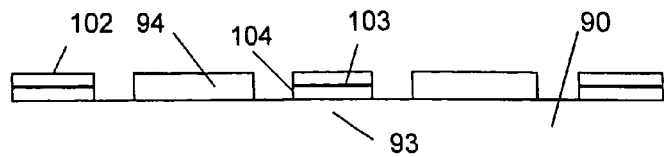
FIGS. 10A-10E are drawings illustrating an example of bonding a cover to a MEMS carrier according to the invention.
Figure 10B:
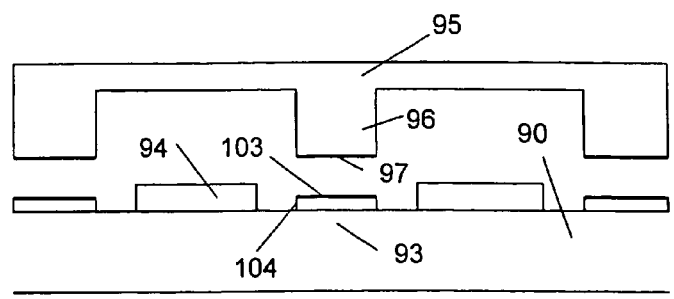
Figure 10C:
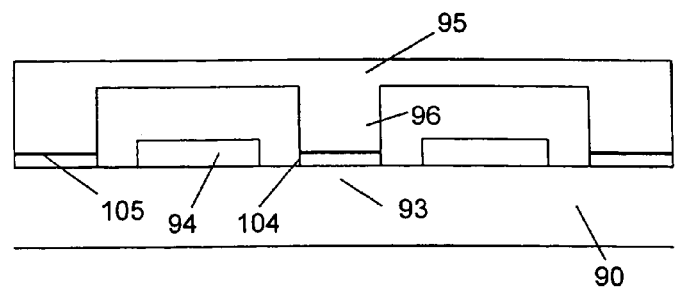
Figure 10D:
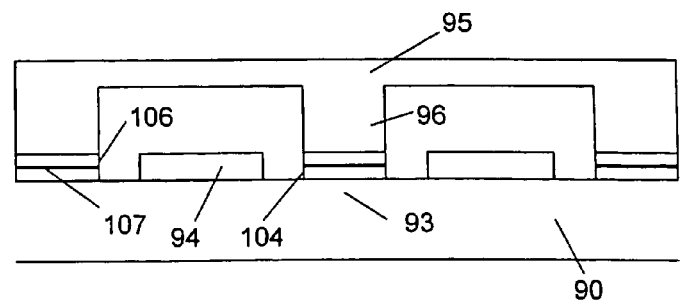
Figure 10E:
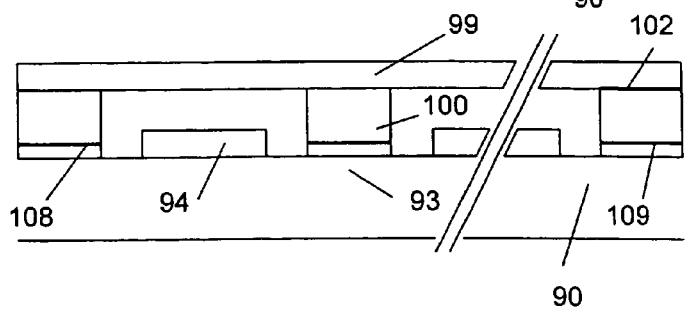

FIGS. 10A-10E illustrate an example of the method where a bonding layer is formed on the carrier, and protected during the formation of MEMS 94. FIG. 10A shows the steps of forming bonding layer 104 on carrier 90, followed by forming protective film 102 on bonding layer 104, and forming MEMS 94 on carrier 90. As an example, carrier 90 could be a silicon substrate and bonding layer 104 could be a deposited oxide layer having the appropriate surface roughness and planarity characteristics to facilitate room temperature bonding. As shown in FIG. 10B, film 102 has been removed after the formation of MEMS 94, and a cover 95 having portions 96 with surfaces 97, prepared with the appropriate surface roughness and planarity characteristics, in position to be bonded to surface 103 of bonding layer 104. Surface 97 is brought into direct contact with surface 103 and bonded, to form bond 105 as shown in FIG. 10C. FIG. 10D represents a modification of the method shown in FIGS. 10A-10C where bonding layer 106 is formed on portions 96, with appropriate surface and planarity characteristics. The surface of film 106 is brought into contact with surface of film 104 and bonded to form bond 107. Another modification of the method shown in FIGS. 10A-10C is illustrated in FIG. 10E, where the cover consists of plate 99 and portions 100 formed on plate 99. The surfaces of portions 100 are prepared as discussed above, and bonded to film 104 to form bond 108. The right hand portion of FIG. 10E shows a further modification where portion 100 is bonded to plate 99 and to the surface of layer 104 to form bond 109. In either instance, portion 100 could be an oxide or silicon material, and plate 99 could be a silicon plate.

In each of the examples shown in FIGS. 7A-7D, 8A-8D, 9A-9E and 10A-10E, a durable and complete hermetic seal is obtained.

Figure 11A:
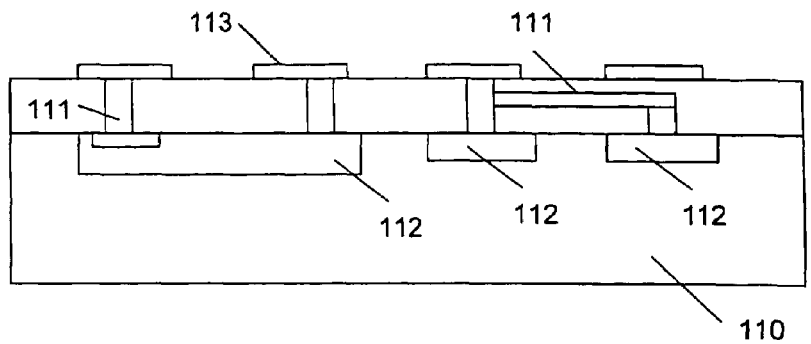
FIGS. 11A-11D are diagrams of a cover containing active devices.
Figure 11B:
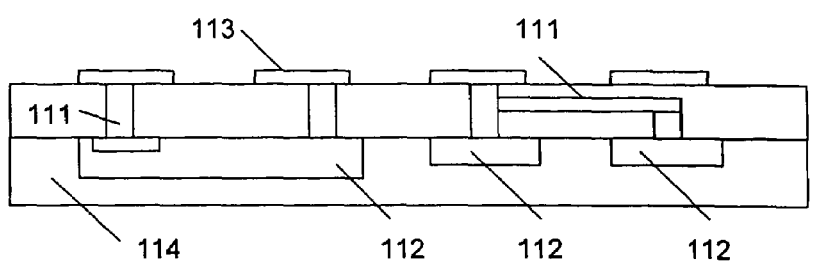

Another embodiment of the invention is shown in FIGS. 11A-D. FIG. 11A is a semiconductor substrate in which active devices, circuit elements or an integrated circuit, for example, are formed. The sizes of the elements in FIGS. 11A-11D are not to scale but are drawn to illustrate the principles of the invention. The semiconductor substrate may be various materials such as silicon, silicon-on-insulator. III-V materials, etc., and any type of device, circuit or circuitry may be formed in the substrate. Shown generally in FIG. 11A are a substrate 110 in which active regions 112 are connected to pads 113 using interconnects 111. Active regions 112 make up devices, circuits or an integrated circuit, as fitting to the particular application. In FIG. 11B, substrate 110 has been partially removed to leave remaining substrate portion 114 by a process including lapping, grinding, polishing and/or etching. The removal process may also include attaching a surrogate substrate to the top side of the substrate, removing the substrate material, and then removing the surrogate substrate. The structure shown in FIG. 11B may be used as a part of the cover for the MEMS device. The amount of material removed depends on the desired thickness of the cover for encapsulating the MEMS. For example, the FIG. 11B structure may be used instead of plate 75 in FIGS. 7C and 8B or instead of plate 99 in FIGS. 9E and 10E.

Bonding a substrate having active devices or circuits or having an integrated circuit places the devices or circuitry needed and/or desired to be connected to the MEMS proximate to the MEMS device. The substrate becomes part of the encapsulated MEMS structure and the two can be easily interconnected. Vias may be formed in the substrate and interconnections may be formed between the devices or circuits in the substrate with the MEMS device. Such interconnections will be discussed below.

Figure 11C:
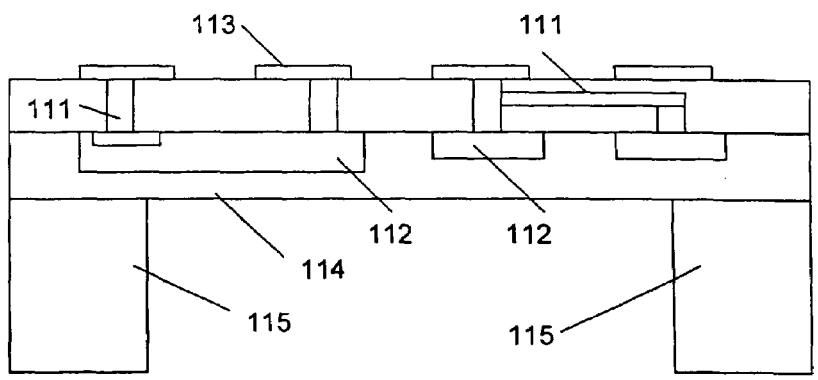

FIG. 11C shows one cover formed using the semiconductor substrate, where elements 115 are formed on portion 114. Portions 114 may be formed by selective deposition techniques or by deposition of a film and etching the film to leave the portions. Portions 114 may be formed when the surrogate substrate is still attached. The bottom surfaces of portions 114 are prepared for bonding in the manner discussed above. In one example, the substrate material is silicon and portions 114 are silicon dioxide. The surrogate substrate may be removed following formation of portions 114.

Figure 11D:
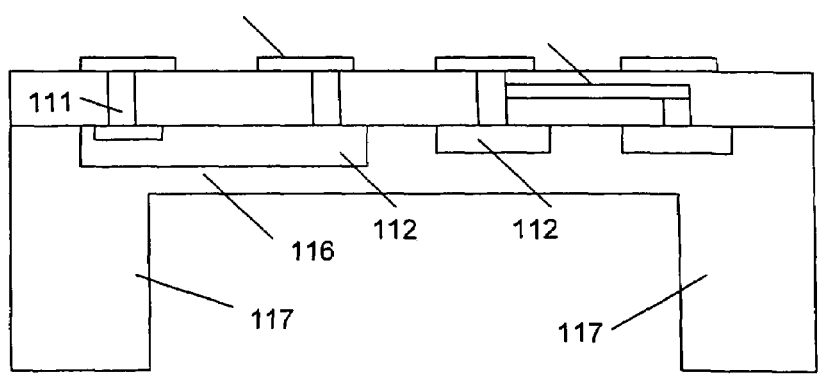

The substrate may also be formed as shown in FIG. 11D. Substrate 110 is thinned to leave a thickness appropriate for forming portions 117, and then the substrate is etched to form portions 116 and 117. The surface of portions 117 is prepared as discussed above, and bonded to the MEMS carrier as shown in FIGS. 7A-7D, for example.

Figure 12A:
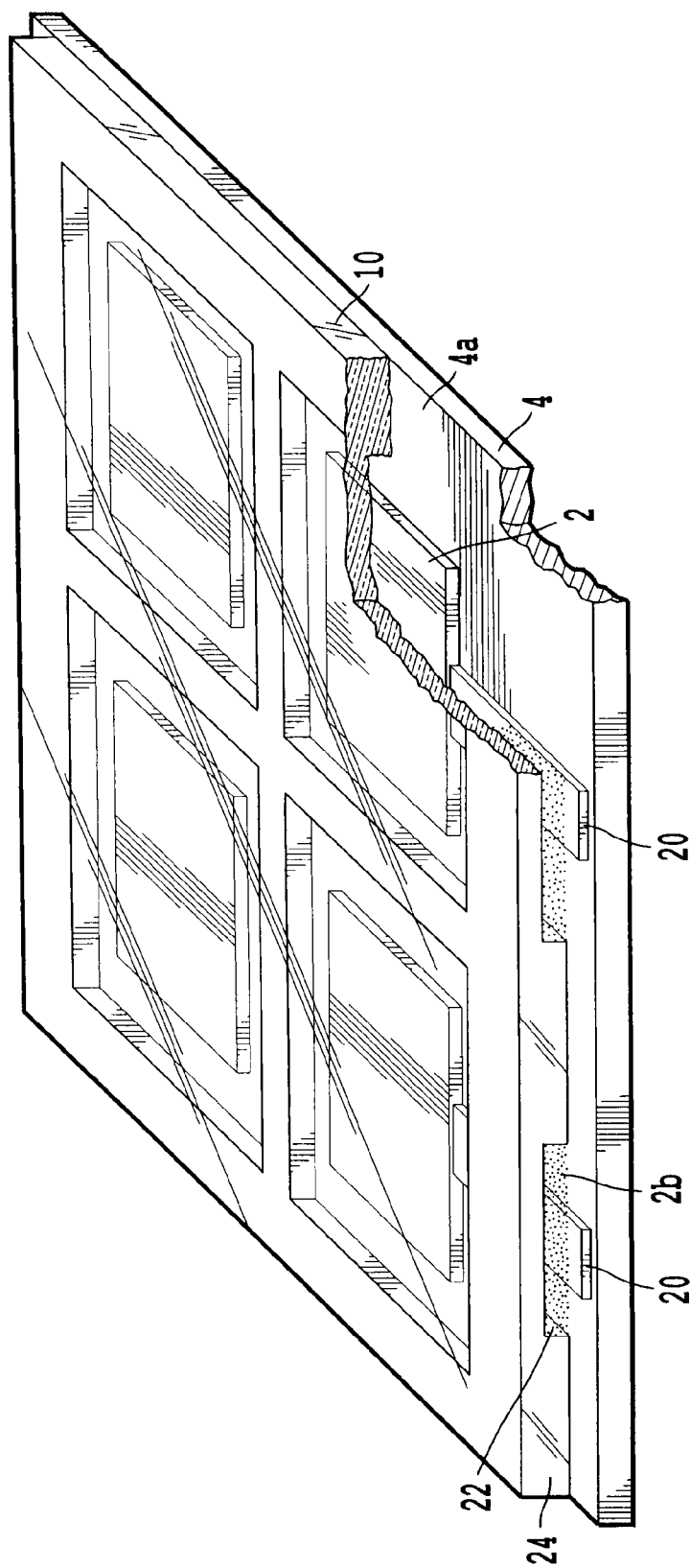
Figure 12C:
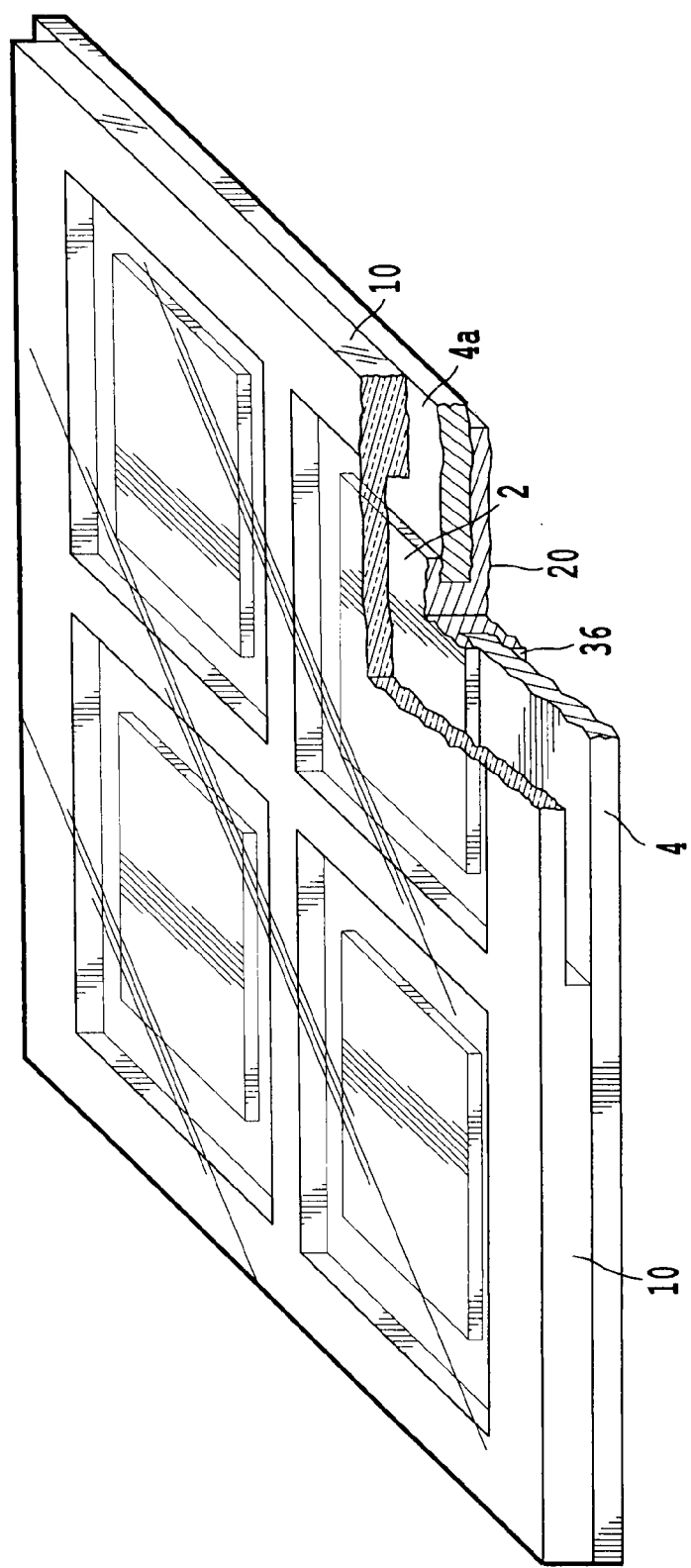

A MEMS encapsulation package typically requires a way to provide electrical connection from outside the hermetic package to components within the hermetic package without compromising the hermetic integrity. Such electrical connection can be made with an electrical conductor like aluminum or gold. FIGS. 12A-12C are schematics illustrating examples, according to the present invention, for providing electrical or optical interconnection from the outside world to the encapsulated devices of the present invention where the connection is brought outside the hermetic seal either on the surface or on the backside of the MEMS carrier. FIGS. 12A and 12B illustrate two different approaches for forming this interconnection laterally, between the encapsulating member and the MEMS device substrate. FIG. 12C illustrates an approach for forming this interconnection through the MEMS device substrate. FIG. 12A is a schematic illustrating one approach, according to the present invention, for providing an interconnection 20 (i.e. electrical or optical) to an encapsulated electronic device 2. As shown in FIG. 12A, the encapsulating member 10 is a conduit for an interconnection 20 to the encapsulated electronic device 2. A notch 22 is formed in a wall 24 of the encapsulating member 10 which is wider and deeper than the interconnection 20 in width and height, respectively. One factor in determining the degree of excess width is the alignment tolerance needed when bonding the encapsulating member 10 to the device carrier 4, that tolerance is typically 1-100 microns. The formed notch 22 functions as a void around the interconnection 20. After bonding, the notch 22 is sealed for example by a subsequent metallization to fill the void.

One preferred method to seal the void is to deposit metal into the void to a thickness that seals the void. For example, an electroplating process using "seed" metallic layers on the device carrier 4 and/or the encapsulating member 10 can deposit metal to fill the void and form a hermetic seal between the device carrier 4 and the encapsulating member 10. Techniques for subsequent metal deposition into the voids in the notch 22 can occur by techniques well known to those skilled in the art such as electroplating or metal chemical vapor deposition. Complete hermetic encapsulation is thus formed with a combination of the metal deposition and the non-adhesive direct bonding used in the delineated bonding regions. Consequently, a device can be hermetically sealed and connected to the outside world by this approach of the present invention.

FIGS. 12B and 12B-1 are schematics illustrating another approach, according to the present invention, for providing an interconnection 20 to an encapsulated electronic device 2. The discussion of FIGS. 12B and 12B-1 is confined to electrical interconnections for the sake of simplicity, but the concepts depicted could be applied in a similar manner for optical interconnections. As shown in FIGS. 12B and 12B-1, the device carrier 4 is a conduit for an electrical interconnection 20 to the encapsulated electronic device 2. Here, an electrical interconnection 20 is made by a lateral connection in which the electrical interconnection 20 is routed underneath or interior to the delineated bonding regions 4a on the surface of the device carrier 4. FIGS. 12B and 12B-1 depict a device carrier 4 that has two levels of metallization with an interleaving dielectric layer 28 that has a suitable mechanical specification for bonding. The first level 30 of metal is present outside the bonded region. Neither the first level 30 nor the second level 32 of metal is present at the delineated bonding region. Rather, bonding occurs between an exposed part of the interleaving dielectric layer 28 and the encapsulating member 10. Here, an electrical interconnection 20 to the outside world is made to the first level of metal, and an electrical connection to the electronic device 2 is made to the second level 32 of metal.

A number of semiconductor processes can be used to form the interlevel metal/dielectric/metal structure depicted in FIGS. 12B and 12B-1, but such processes typically consist of a repeated combination of depositions of metal, dielectric and via etches. One example is to first deposit, pattern, and etch a level of metal into a surface of the device carrier to form a desired routing of metal lines. A dielectric substantially thicker than the metal thickness is then deposited and planarized, for example with CMP, to a thickness thicker than the metal so the metal is covered with dielectric. Vias are then patterned and cut from the surface of the dielectric to the metal underneath the dielectric in locations where it is desired to contact this metal. Another level of metal is then deposited that covers the surface of the dielectric, vias and first level of metal exposed by the vias. The second level of metal is then patterned and etched to form a second desired routing of metal lines. This second routing is designed such that this metal is not in the desired location of the bonding surface, so that the CMP of the dielectric forms a bondable surface, and routing of the first metal under this surface forms an electrical connection from inside to outside the encapsulated cavity. Alternatively, a dual damescene process may be used to provide a dielectric layer between two layers of metal that is suitable for bonding without the upper layer of metal.

In one variation of the last approach, the metal/dielectric/metal structure is directly deposited onto the surface of the device carrier. Subsequently, a planarization dielectric is deposited on the surface of the device carrier and on the interlevel metal/dielectric/metal structure to planarize at least a portion of the surface of the device carrier used for non-adhesive direct bonding. Bonding occurs between the encapsulating member and the planarization dielectric. The planarization dielectric can include silicon dioxide, silicon nitride, spin-on glass layers, and dielectric polymers.

When an electrical contact is made from a lateral side, as described above in FIGS. 12B and 12B-1, it is preferable that the material constituting the electrical contact is either subcutaneous to a bondable surface or forms a bondable surface with the surrounding material. An example of the homogeneous surface case is where the interlevel dielectric (ILD) of a typical IC wafer constitutes the bondable surface. In this case, the interconnect metal level below the ILD is the material constituting the electrical contact between the inside and outside of the hermetic cavity. As such, the interconnect metal does not adversely effect the encapsulation formed by bonding of the cap to the MEMS.

Silicon material can also be used as the material constituting the electrical contact. Although silicon is typically a higher resistivity than metal, there may be manufacturing advantages to using silicon vs. metal for the contact material. Furthermore, the resistivity of the silicon material can be reduced with appropriate increases in doping density. These increases may be accomplished in a number of methods including ion implantation and annealing and diffusion. These methods, especially the ion implantation, can be selective in that the areal variations at the bonding surface may be varied (for use for example in the heterogeneous bonding surface case), and doping variations can be subcutaneous to the bonding surface (for use for example in the homogeneous bonding surface case).

FIG. 12C is a schematic illustrating another approach, according to the present invention, for providing an interconnection 20 via holes etched in the device carrier 4. As shown in FIG. 12C, the device carrier 4 is a conduit for an electrical or optical connection to the encapsulated electronic device 2 (e.g. an encapsulated MEMS device). After bonding, the device carrier 4 (e.g., the MEMS device wafer) is preferably but not necessarily thinned to about 100 μm, although device carriers of less than 25 μm may be used. The thinning can occur by grinding, chemical mechanical polishing and/or etching. In general, it is preferable for the device carrier to be as thin as practicable. However, due to the cavity formed by the MEMS encapsulation, the device carrier thickness can not, in general, be made arbitrarily thin. One factor in limiting the device carrier thickness to a minimum thickness is that the cavity formed around an encapsulated electronic device, i.e. an area around the plan area and shape of the encapsulated electronic device, defines the suspension of the cavity, from the backside, by the residual device carrier thickness. Thus, in general, encapsulated structures with smaller cavities can have smaller device carrier thicknesses, even as thin a few tens of microns for very small cavities.

To allow the device carrier thickness to be further thinned, the encapsulation member and MEMS device can be designed to provide for delineation of bonding areas interior to that required for encapsulation. This effectively reduces the size of the cavity and allows a thinner final device carrier thickness after thinning. This structure is similar to FIGS. 1A and 2A where four encapsulation areas are shown and a single MEMS device includes the MEMS components within the four encapsulation areas, whereby, the bonding around all four MEMS device areas is for encapsulation and the bonding between the four MEMS device areas is for additional structural support. This additional structural support also allows the encapsulation member to be thinned to a greater extent.

With or without thinning, an interconnect 20 through the backside can be made. Electrical contact can be done, for example, by cutting via holes 36 through the remaining substrate of the device carrier 4 to an electrical contact pad or a location that connects to the encapsulated device within the cavity. Optical contact can occur by an optical fiber embedded in the via hole 36 and coupled to a receptor on the encapsulated device. The vias hole 36 being located interior to the delineated bonding regions 4a are designed in conjunction with the MEMS device to ensure that the hermetic integrity of the encapsulation is not adversely affected. For example, for an electrical connection, the via hole 36 is formed through the residual MEMS device carrier thickness to a metallization on the MEMS device carrier without forming a hole in this metallization, causing delamination of this metal from the MEMS device carrier, or other action that would likewise adversely affect the integrity of the encapsulation. After formation of the via hole, the via hole can be metallized to provide an electrical connection to the encapsulated electronic chip device. In one approach, the electrical contact can be connected to bonding pad, solder ball pads, etc. that are preferably located over the bonded area, as opposed to being located in the cavity area, thereby to minimize damage to the encapsulated device when applying force to these pads during subsequent packaging of the part.

As noted above, the present invention allows for optical or electrical interconnection to the encapsulated device. In this case of optical interconnection, an optical fiber is accommodated instead of or in addition to the electrical interconnects. The use of a optical interconnect, while complicated by the fact that the optical fiber will usually be much larger (typically 50-500 microns) than an electrical interconnect (typically 0.5-2 microns), offers the advantage that the optical fiber surface is typically made of a glass or related dielectric material and as such is a preferred bonding surface compared to a metal surface that is present with an electrical interconnect.

One approach for accommodating the optical fiber is to form a trench in the device carrier surface, similar to the metal/dielectric/metal structure shown in FIGS. 12B and 12B-1, which extends from inside the desired cavity encapsulation to outside the desired cavity encapsulation along a preferred path for the fiber. The depth of the trench is preferably a significant fraction of the fiber diameter, and can also include the entire diameter of the fiber, so that the trench can hold the fiber. After the fiber is in the trench, the surface is then planarized with a bondable material in the vicinity of the bonded region, so that the cap can be bonded as described previously. This planarization may be done before MEMS device fabrication so as to not adversely affect the MEMS devices.

It is also possible, to form the trench in the cap, and planarize the cap in the vicinity of the bonded region. A typical method of planarization include a dielectric deposition followed by CMP.

Figure 13A:
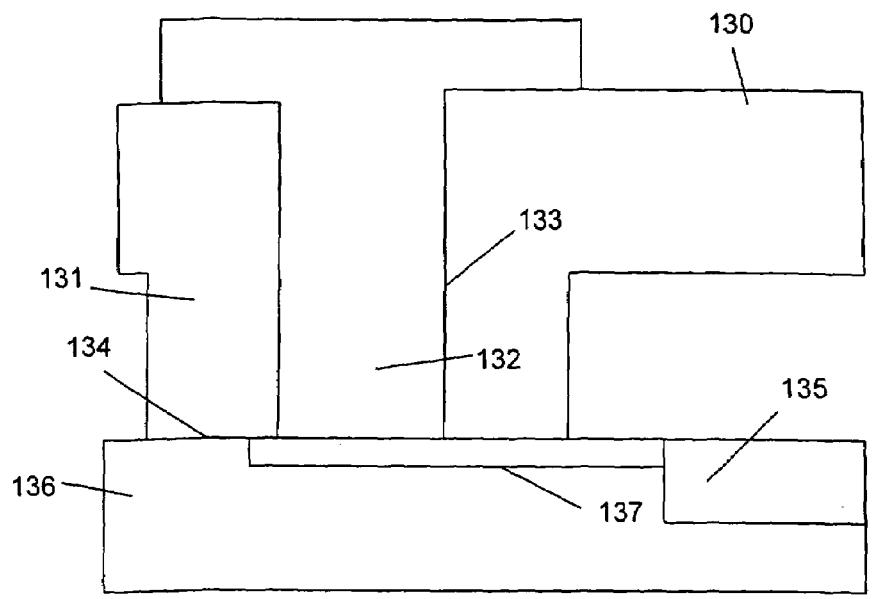
FIGS. 13A-13C are schematics illustrating approaches, according to the present invention, for providing electrical connection to the hermetically encapsulated devices of the present invention through an extended portion of an encapsulating member.
Figure 13B:
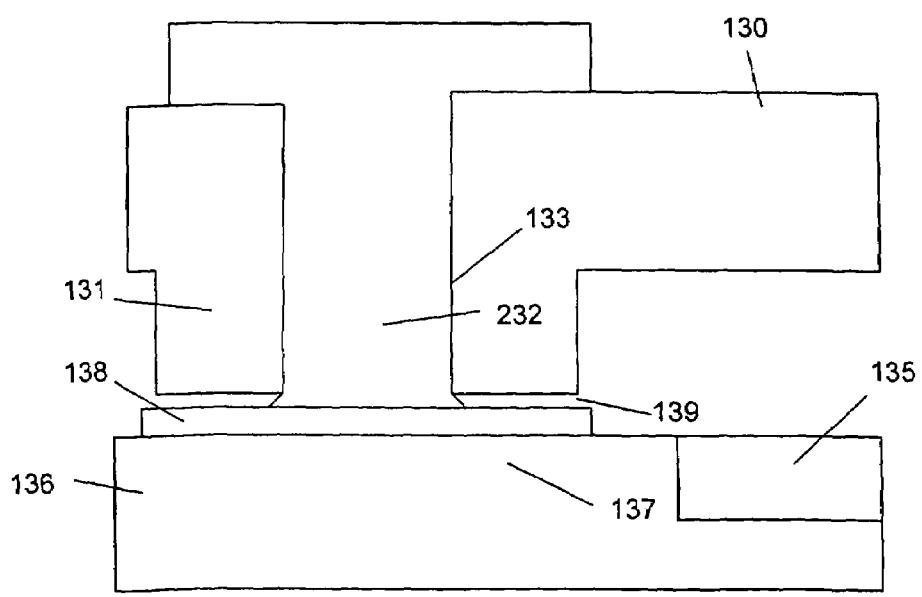
Figure 13C:
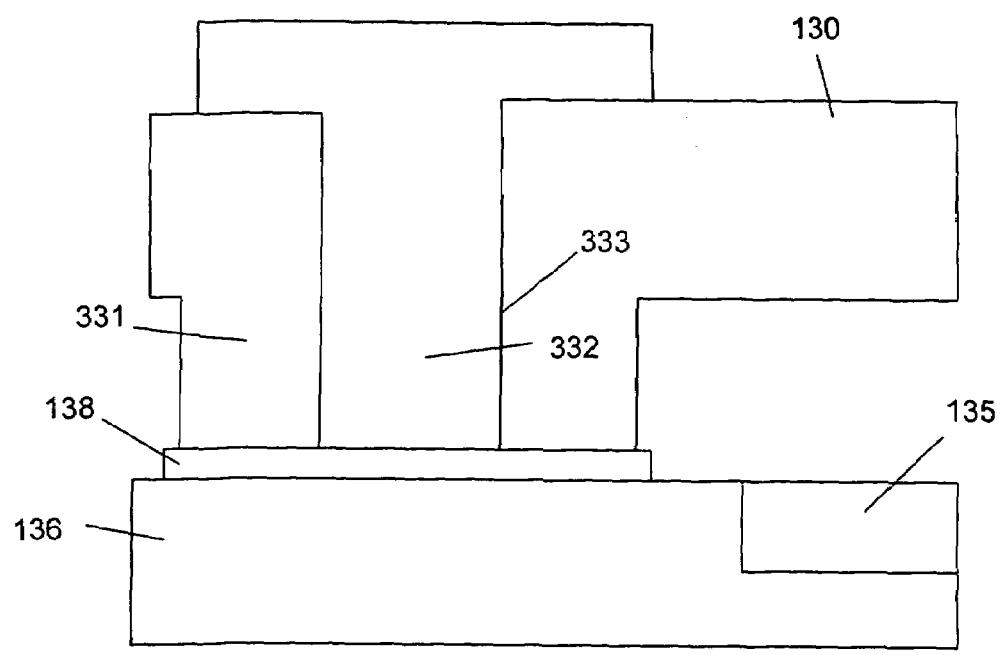

An electrical interconnection can also be made through the encapsulation member. FIGS. 13A-13C illustrates approaches to make this type of interconnection. FIG. 13A is similar to FIGS. 1A and 2A in that the encapsulating member 130 and MEMS device 135 are designed such that an encapsulating bond 134 is formed interior to the MEMS device with portion 131 of member 130. Portion 131 corresponds to the sections of interposer 6 between the MEMS 2 in FIG. 1A, for example. Here it is noted that MEMS 135 is formed in the device carrier 136, i.e., the MEMS substrate and the device carrier are the same element. It is also noted that portions 131 may be material deposited on a plate, as in FIG. 11C. After the encapsulation bond has been formed, a via 133 is formed through this interior encapsulation bond, without adversely affecting the encapsulating integrity, extending from the exterior surface of the encapsulating member 130, through the encapsulating member to the bondable surface of the MEMS device. If this bondable surface is suitably conductive, a metal contact directly to the MEMS device surface can be made at this point and brought out to the exterior surface of the MEMS encapsulation member. FIG. 13A shows a conductive region 137 extending from the MEMS 135 to the bonding surface 134. Contact 132 is connected to region 137. If this bondable surface is not suitably conductive, and there is a suitably conductive region below the surface, for example as described above, the via is further formed through the MEMS device surface to this conductive region and then a metal contact directly to this conductive region is made and brought out to the exterior surface of the MEMS encapsulation member.

The via formation in the encapsulating member may occur prior to bonding or after bonding. If after bonding, the encapsulating member may be thinned to facilitate via formation. If before bonding, the vias may be etched to a depth less than the encapsulating member thickness and then exposed to the exterior surface after bonding by thinning of the encapsulation member.

It may also be desirable to make an electrical connection through the encapsulation member directly to the MEMS device surface to a material that is not bondable. An example of such a material is a typical metallization structure like a bond pad typically used for wire bonding. FIG. 13B illustrates an approach to accomplish this objective. MEMS 135 is formed in device carrier 136, and a bonding pad 138 is connected to MEMS 135 (the connection is not shown). The portion 231 of carrier 136 is positioned above pad 138 to leave a gap 139. A contact 232 is formed in aperture 133. Metallization 232 is formed through aperture 233 to connect with pad 138, and to seal the cover.

This figure is similar to FIG. 12A in that the bonding of the encapsulation member does not result in contact between the encapsulation member and the material, i.e., bond pad, on the MEMS device surface. However, the encapsulating member does extend as close as practicable, within standard manufacturing tolerances, to not interfere with bringing the bondable surfaces together, and not too far apart to complicate the electrical formation described below. The plan cross-sectional area of the encapsulation member directly above this bond pad is large enough to allow a via to be formed through it, either before or after bonding as described above. A typical height of this portion of the encapsulation above the bond pad is 0.2 to 2 microns, and preferably 0.1 to 1.0 microns. After encapsulation bonding, the MEMS device is fully encapsulated except for the gap formed by the height of this encapsulation above the bond pad. The via is then filled with sufficient metal thickness not only to route metal out of the via to an exterior surface of the encapsulating member as described above, but also to seal this gap. Examples of techniques to fill the via with metal include sputtering, e-beam and thermal metallization. A potential advantage of this approach is that a vacuum environment can be easily sealed within the encapsulation with this approach because the typical metal filling techniques are performed in a vacuum environment. This is distinct from the other approaches described to provide electrical interconnection because although the encapsulating bonding can be performed in a vacuum environment, it is easier and more manufacturable to perform the bonding at or near atmospheric pressure.

Note that in general, interconnections through the encapsulation member as shown in FIGS. 13A and 13B provide improved internal support to the MEMS device and allow the residual MEMS device substrate and the encapsulating member to be thinned further for a given cavity size. Furthermore, these interconnections are compatible with conventional solder bump formation processes that are preferred for the formation of flip chip devices for advanced packaging. An example of how this is done is by forming an underbump metallization on the interconnect metallization that is formed in the via that extends through the encapsulation member and/or on the interconnect metallization that is routed across an exterior surface of the encapsulation to a preferred location, for example a location around the MEMS device where the bonding encapsulation is formed to provide superior mechanical strength. The routing on an exterior surface may be on an insulating layer formed on the exterior surface of the encapsulating member if necessary to provide suitable electrical isolation. Solder bumps are then formed on this underbump metallization as part of a conventional process flow and the encapsulated MEMS devices can then be flip chip mounted as typically done for further assembly.

FIG. 13C illustrates the example where contact 138 and extended portion 331 are in physical contact, and no bond is formed between portion 331 and contact 138. A contact 332 preferably formed of metal is formed through aperture 333. It is preferred that portion 331 is made from a material having a greater degree of flexibility, such as a thin layer of silicon, less than about 50-100 microns, for example.

Figure 14A:
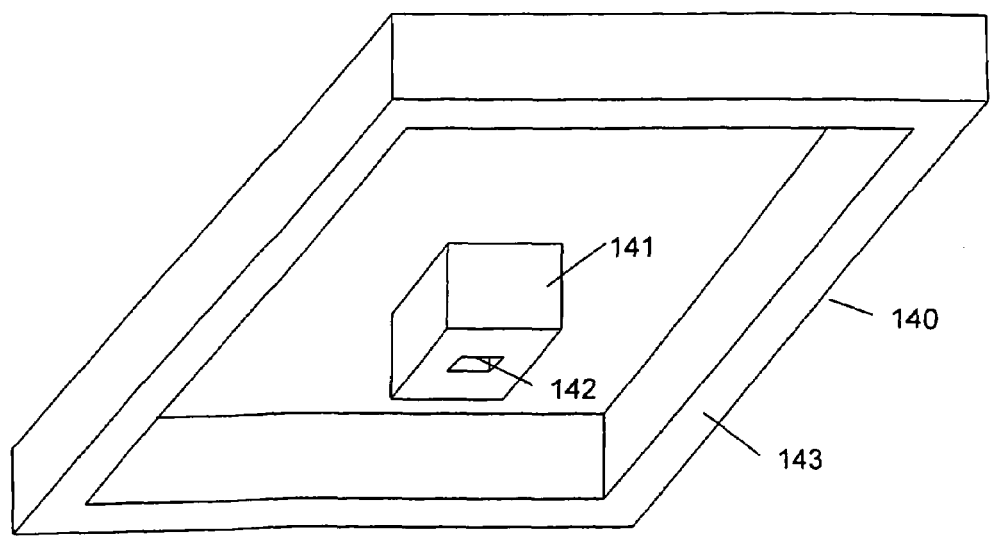
FIGS. 14A-14D are diagrams of an example of an encapsulating member having provision for electrical connection to a hermetically sealed device through the upper surface of the member.
Figure 14B:
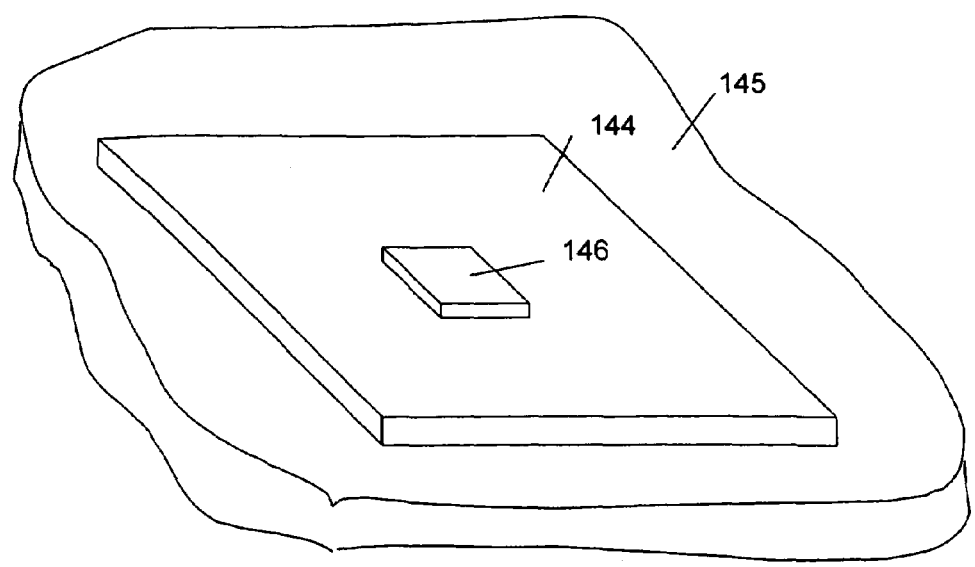
Figure 14C:
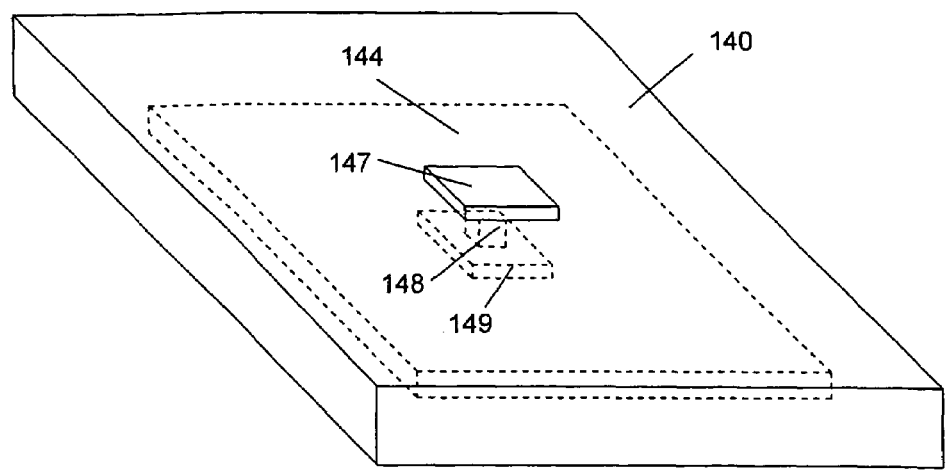

FIGS. 14A-14D illustrate further examples of connections made through the encapsulating member. Here, the structure has a connection through the upper surface of the encapsulation member. Encapsulating member 140 has an extending portion 141 having an aperture 142. The cover 140 is designed to mate with MEMS 144 formed on substrate 145, as shown in FIG. 14B. MEMS 144 has a conductive contact 146, such as a metal pad. Alternatively, MEMS 144 may have a conductive region, such as a doped silicon region, to which contact may be made. Bonding surface 143 of encapsulating member 140 is bonded to the surface of substrate 145 in the manner described above. After bonding, a contact 147 on the surface of encapsulating member 140 is formed using standard metallization and patterning techniques, producing the structure shown in FIG. 14C. Metal connection 148 is formed by depositing metal into aperture 142.

Figure 14D:
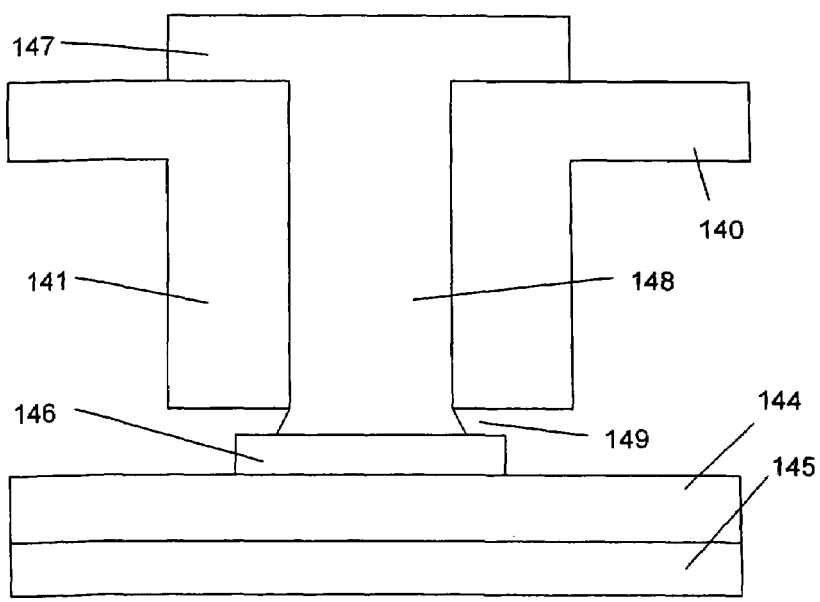

A cross-section of the connection structure is shown in FIG. 14D. Extending portion 141 is aligned with the conductive pad 146 of the MEMS 144. There is a small gap 149, typically 0.2 to 2.0 microns, between the pad 146 and portion 141. One advantageous method of forming the contact is, after bonding encapsulating member 140 to the substrate 145, to place the device in an evacuated metallization chamber allowing the interior volume enclosed by the encapsulating member 40 to be evacuated. The metal plug 148 and pad 147 are then formed, sealing the aperture and maintaining the hermetic encapsulation.

It is noted that FIGS. 14A-14D illustrate one encapsulating member bonded to cover one MEMS device. However, the cover 140 could consist of a plurality of enclosures, similar to FIG. 1A, where a contact is made to each of the plurality of MEMS chips. Also, cover 140 could be a substrate having active devices, circuits or an integrated circuit, as in FIGS. 11A-11C.

Figure 14E:
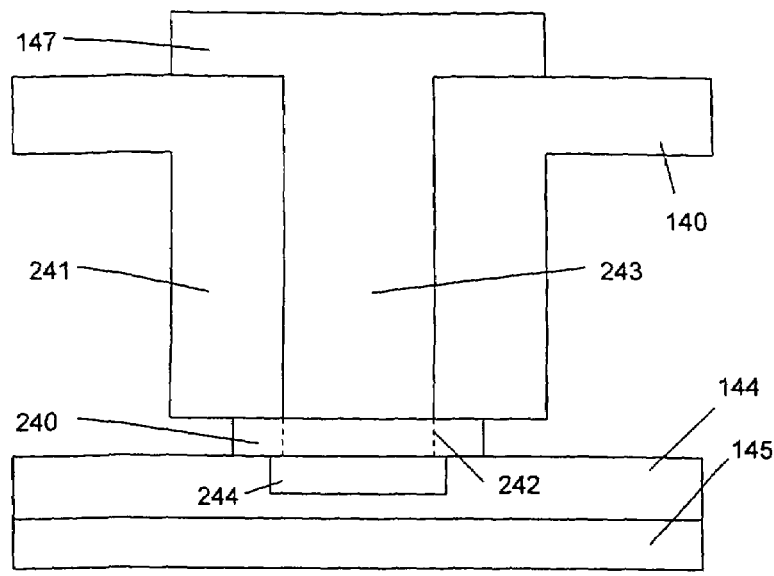
FIG. 14E are cross section diagrams of the connection to the hermetically sealed device.

FIG. 14E illustrates a modification of the encapsulating cover having the extending portion. Extending portion 241 contacts the surface of film 240. In one example film 240 is a conductive material such as metal. Extending portion 241 contacts the metal film, but is not bonded to the metal film. A contacting via 243 is formed in aperture 142 to contact the metal film. In another example, film 240 is an oxide film formed on the surface of the MEMS. It may be formed as part of the MEMS, or as part of the selective oxide film formation on the device carrier, such as film 78 in FIG. 8A. Extending portion 241 may be bonded to film 240 if the oxide film is prepared to have the desired surface roughness, and activated. If the oxide film is formed with the desired surface roughness, then only activation may be needed. The oxide film may be formed over a contact or a conductive region 244 in the MEMS, and a contact may be made to the underlying contact or conductive region 244 by etching the oxide film, using aperture 142. This is shown by the dashed lines in FIG. 14E.

Figure 15C:
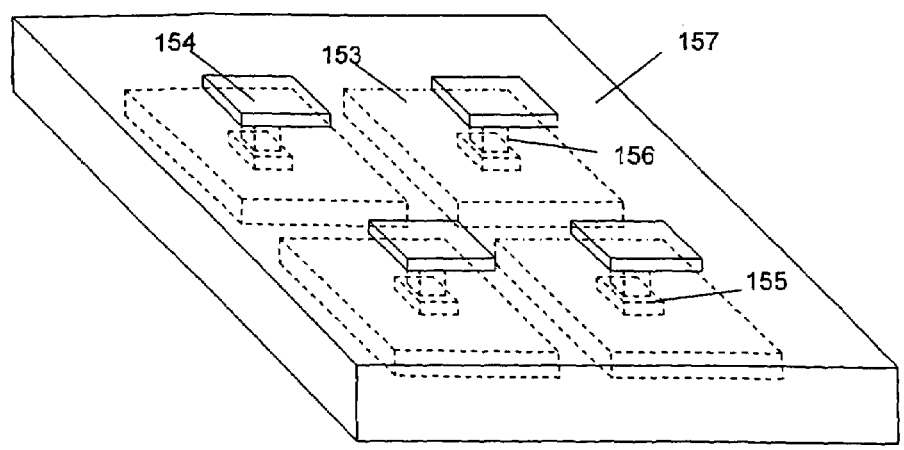
FIGS. 15A-15C are diagrams of an example of an encapsulating member having provision for multiple electrical connections to a hermetically sealed device through the upper surface of the member.
Figure 15A:
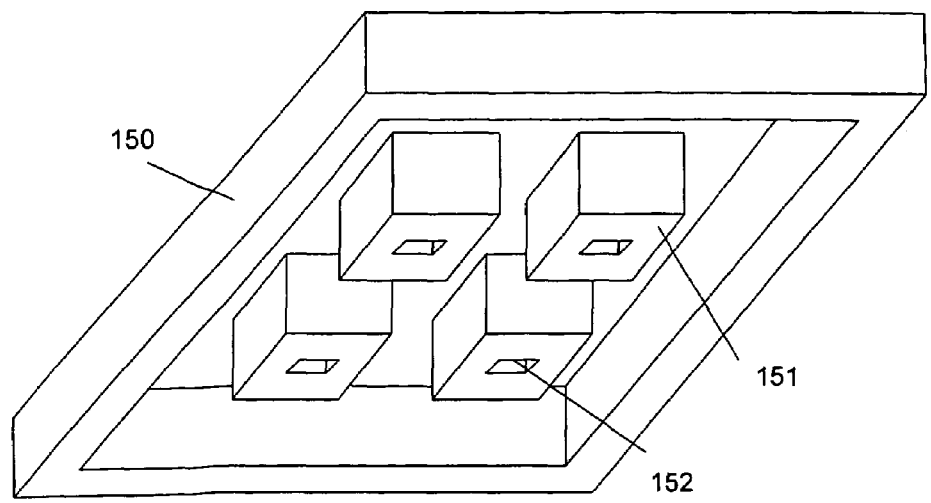
Figure 15B:
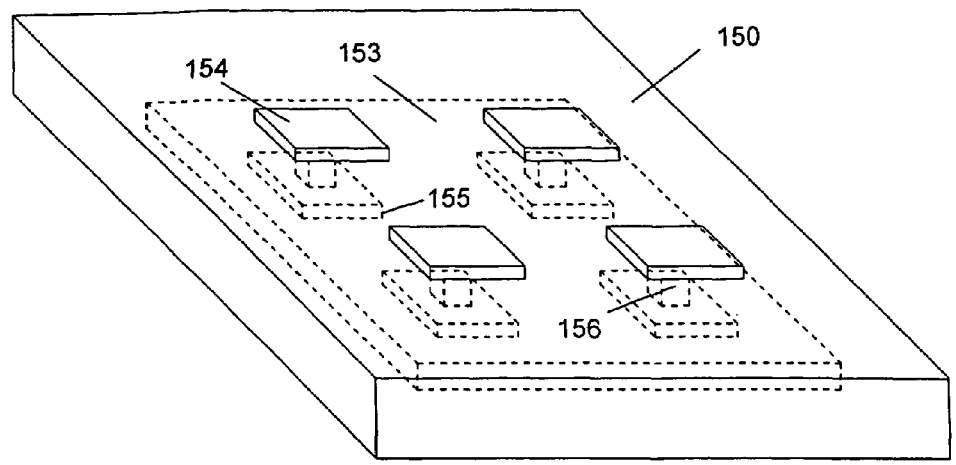

Another example is shown in FIGS. 15A and 15B. In this example encapsulating member 150 has four protruding portions 151 each having an aperture 152. The portions 151 align with pads 155 on a MEMS 153. The encapsulating member 150 is bonded to the substrate surrounding MEMS 153, and subsequently the interconnections are made. Interconnections are preferably made in a vacuum apparatus where the interior of encapsulating member 150 is evacuated, and vias 156 and pads 154 are formed in vacuum. Metal connections 156 contact the MEMS pads 155, seal apertures 152 and maintain the hermetic seal, as shown in FIG. 14D. Again, the encapsulating member 150 could be formed in a manner as shown if FIG. 1A where the cover consist of a plurality of enclosures hermetically sealing a plurality of MEMS. Also, member 150 could be a substrate having active devices, circuits or an integrated circuit, as in FIGS. 11A-11C.

In FIG. 15C, the encapsulating member 157 hermetically seals four MEMS 153. One contact pad 154 formed on the surface of encapsulating member 157 contacts a corresponding conductive pad 155 on each MEMS 153 using the metallization 156 formed in the aperture 152.

Figure 16A:
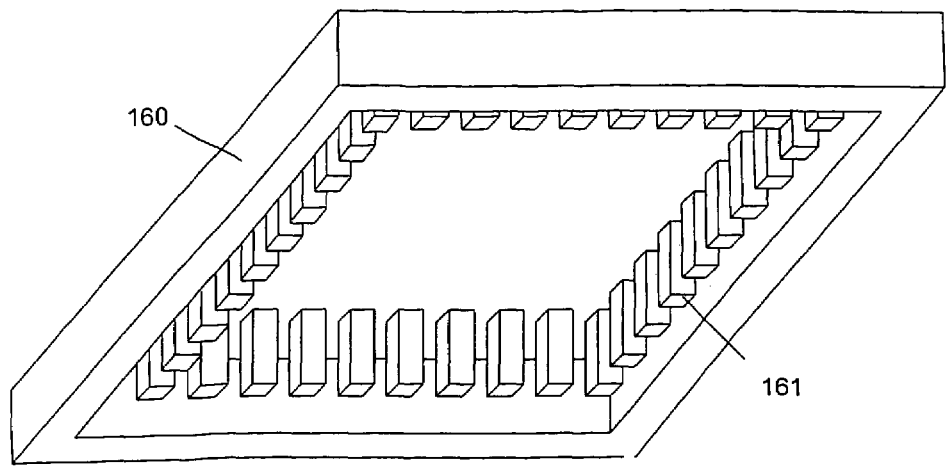
FIGS. 16A-16D are diagrams of an example of an encapsulating member having provision for electrical connections, in a pin grid arrangement, to a hermetically sealed device through the upper surface of the member.
Figure 16B:
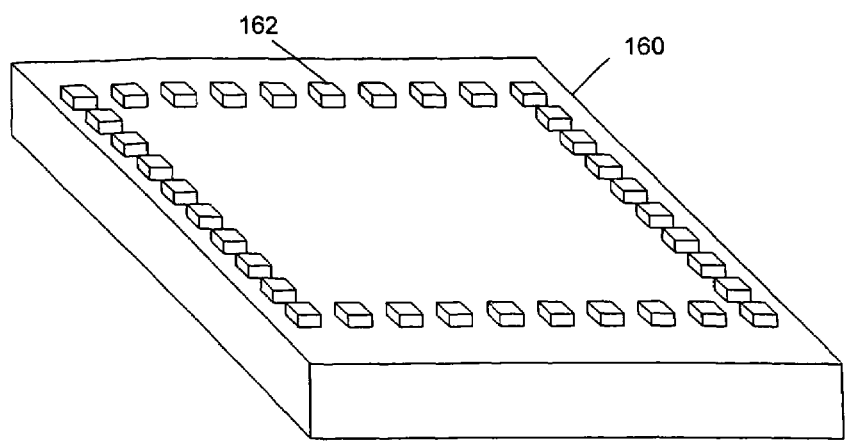
Figure 16C:
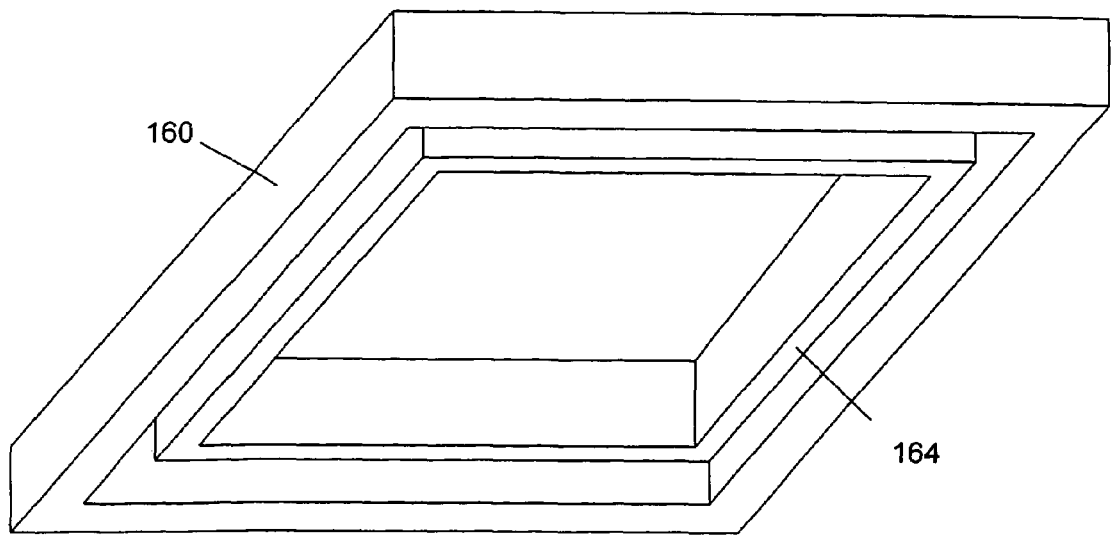
Figure 16D:
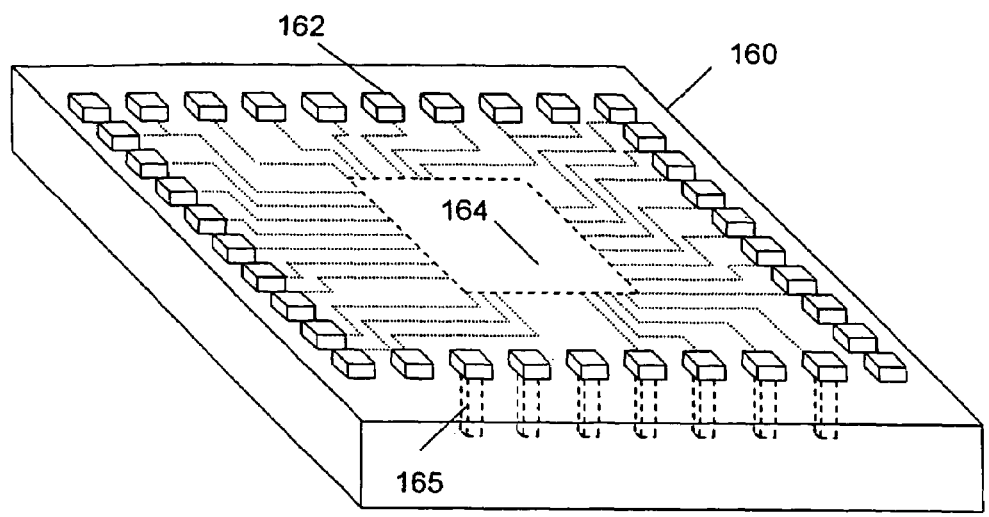

A further example of an encapsulating member according to the invention is shown FIGS. 16A-16D. In this example, a pin grid array is formed in the encapsulating member using a plurality of portions 161, each having an aperture (not shown). The upper surface of the encapsulating member is shown in FIG. 16B where an array of pads 162 is formed contacting corresponding pads in a MEMS device, or a number of MEMS devices hermetically sealed by the encapsulating member 160. As discussed above in FIGS. 11A-11C, the encapsulating member 160 could consist of a silicon substrate in which devices, circuits or an integrated circuit is formed. Pads 162 could then contact to either or both of the MEMS device and the devices, circuits or integrated circuit in the encapsulating member 160. This arrangement is especially advantageous for subsequent bonding to packaging or other integrated circuits having a matching arrangement of conductive pads. An alternative manner of forming a pin-grid array encapsulating member 160 is shown in FIG. 16C where the individual portions 160 are replaced by a ring portion structure 163 having a plurality of apertures (not shown) corresponding to pads on a MEMS device or MEMS devices. FIG. 16D illustrates an integrated circuit 164 interconnected with pads 162. Some of the pads are connected only to the integrated circuit 164, while other pads are connected to a MEMS using conductive vias 165. Other pads are connected to both integrated circuit 164 and the MEMS. Many arrangements are possible.

Numerous modifications and variations of the present invention are possible in light of the above teachings. For example, more than one type of the contacts described above may be made in the same structure, such as a contact over the encapsulated device as in FIGS. 14A-14E combined with a contact through a bonded region as in FIGS. 13A-13C. It is therefore to be understood that within the scope of the appended claims, the invention may be practiced otherwise than as specifically described herein.

The invention claimed is:

1. A method for packaging a device, comprising:
    obtaining an encapsulating member configured to enclose said device and having a first surface area for direct bonding;
    obtaining a device carrier including the device and having a second surface area with a surface roughness for direct bonding to said first surface area;
    protecting substantially only said second surface area during fabrication of said device such that said surface roughness of said second surface area is not degraded during said fabrication; and
    bonding said first surface area of the encapsulating member to said second surface area of the device carrier to encapsulate said device.

2. A method as recited in claim 1, wherein said bonding comprises hermetically encapsulating said device.

3. A method as recited in claim 1, wherein said device carrier comprises a substrate, said device formed on said substrate, said method comprising:
    preparing a surface area of said substrate for direct bonding before fabricating said device;
    protecting substantially only said surface area of said substrate during fabrication of said device such that said surface roughness of said surface area of said substrate obtained using said preparing step is not degraded during said fabrication.

4. A method as recited in claim 3, wherein:
    said protecting comprises fabricating said device in a manner where said surface roughness of said surface area of said substrate is not degraded.

5. A method as recited in claim 1, comprising:
    preparing said first and second surface areas to have a surface roughness in a surface roughness range; and
    said protecting step comprises maintaining said surface roughness in said range.

6. A method as recited in claim 3, wherein:
    said protecting comprises forming a protective layer on substantially only said surface area of said substrate.

7. A method as recited in claim 6, comprising:
    removing said protective layer after substantially completing fabricating said device.

8. A method as recited in claim 1, comprising:
forming a first bonding layer on said device carrier, a surface of said bonding layer being said second surface area; and
bonding said first surface area of said encapsulating member to said surface of said first bonding layer.

9. A method as recited in claim 8, wherein:
said protecting comprises forming said protective layer on said first bonding layer.

10. A method as recited in claim 9, comprising:
removing said protective layer after substantially completing fabricating said device.

11. A method as recited in claim 8, comprising: preparing said surface of said first bonding layer for direct bonding.

12. A method as recited in claim 11, comprising:
preparing said surface of said first bonding layer and said first surface area each to have a surface roughness in a range of no more than about 0.5-1.0 nm.

13. A method as recited in claim 12, comprising:
activating said surface of said first bonding layer; and activating said first surface area.

14. A method as recited in claim 13, wherein each of said activating steps comprises an etching process where a surface roughness of said surface of said bonding layer and a surface roughness of said first surface area before and after said etching are each substantially the same.

15. A method as recited in claim 8, comprising:
forming a second bonding layer on said first surface area; and
bonding said first bonding layer to said second bonding layer.

16. A method as recited in claim 15, wherein forming said first and second bonding layers comprises forming a silicon oxide film.

17. A method as recited in claim 15, wherein forming at least one of said first and second bonding layers comprises ion implanting at least one of oxygen and nitrogen into said surface of said encapsulating member and said surface area of said device carrier, respectively.

18. A method as recited in claim 1, comprising:
preparing said second surface area of said device carrier to have a surface roughness in a range of no more than about 0.5-1.0 nm; and
activating said second surface area of said device carrier.

19. A method as recited in claim 1, comprising:
forming a bonding layer on said encapsulating member; and
bonding said bonding layer to said second surface area.

20. A method as recited in claim 1, wherein said encapsulating member is a substrate having one of an active device, circuit, circuit element and integrated circuit formed therein.

21. A method as recited in claim 20, comprising:
connecting said one of an active device, circuit, circuit element and integrated circuit to said device.

22. A method as recited in claim 21, comprising:
forming an aperture through said encapsulating member; and
connecting said one of an active device, circuit, circuit element and integrated circuit to said device through said aperture.

23. A method as recited in claim 21, comprising:
forming an aperture through said encapsulating member over said device; and
connecting said one of an active device, circuit, circuit element and integrated circuit to said device through said aperture.

24. A method as recited in claim 21, comprising:
forming said encapsulating member to have a region over said first surface area and separated from said first surface area by a gap;
forming an aperture in said encapsulating member in said region over said first surface area; and
connecting said one of an active device, circuit, circuit element and integrated circuit to said device through said aperture.

25. A method as recited in claim 24, comprising:
hermetically sealing said device.

26. A method as recited in claim 24, comprising:
placing said bonded encapsulating member and device carrier in a vacuum after forming said aperture; and
performing said connecting in said vacuum.

27. A method as recited in claim 24, comprising:
forming said encapsulating member to have a gap of approximately between 0.1 and 1.0 microns.

28. A method as recited in claim 21, comprising:
forming said encapsulating member to have an extended portion located over said device and separated from said device by a gap; and
forming an aperture through said extended portion; and
connecting said one of an active device, circuit, circuit element and integrated circuit to said device through said aperture.

29. A method as recited in claim 28, comprising:
forming said encapsulating member to have said extended portion located over a conducting portion of said device.

30. A method as recited in claim 21, comprising:
forming said encapsulating member to have an extended portion located over said device and contacting said device, said extended portion not being bonded to said device; and
forming an aperture through said extended portion; and
connecting said one of an active device, circuit, circuit element and integrated circuit to said device through said aperture.

31. A method as recited in claim 30, comprising:
forming said encapsulating member to have said extended portion located over a conducting portion of said device.

32. A method as recited in claim 1, comprising:
forming a plurality of contacts to said device through said encapsulating member.

33. A method as recited in claim 1, comprising:
preparing said first surface area to a surface roughness no more than about 0.5-1 nm; and
preparing said second surface area of said device carrier to a surface roughness no more than about 0.5-1 nm.

34. A method as recited in claim 1, wherein said obtaining an encapsulating member comprises:
providing in said encapsulating member a relief configured upon said bonding to provide clearance from said device.

35. A method as recited in claim 1, comprising:
forming a cavity in said encapsulating member with a pattern contoured in relation to the device; and
bonding said encapsulating member to said device carrier with said cavity positioned to oppose said device.

36. A method as recited in claim 1, wherein obtaining said encapsulating member comprises:
forming material on a plate to produce a cavity; and
bonding said material to said device carrier with said cavity positioned to oppose said device.

37. A method as recited in claim 1, wherein obtaining said encapsulating member comprises:

obtaining an interposer having at least one through hole; and bonding a cover to said interposer.

38. The method as recited in claim 1, wherein obtaining said encapsulating member comprises:
preparing a surface of a plate for direct bonding;
preparing a surface of an interposer for direct bonding; and
bonding said interposer to said plate.

39. A method as recited in claim 38, wherein obtaining said encapsulating member comprises:
placing said interposer on said device carrier;
placing said plate on said interposer; and
bonding at the same time said interposer to said device carrier and said interposer to said plate.

40. A method as recited in claim 1, comprising:
preparing said first surface area for said bonding; and
preparing said second surface area for said bonding,
wherein each preparing step comprises at least one of grinding, chemical mechanical polishing, and etching.

41. A method as recited in claim 1, comprising:
providing as said encapsulating member a cover configured to encapsulate a recessed device located in a recess of said device carrier; and
bonding a surface of said cover to said surface of said device carrier.

42. A method as recited in claim 41, wherein said cover comprises a semiconductor wafer having a semiconductor device formed therein.

43. A method as recited in claim 1, comprising:
preparing said first surface area of said encapsulating member and said second surface area of said device carrier each to have a surface roughness in a range of no more than about 0.5-1.0 nm; and
activating said first surface area of said encapsulating layer; and
activating said second surface area of said device carrier.

44. A method as recited in claim 43, wherein said activating comprises:
immersing at least one of said first surface area of said encapsulating layer and said second surface area in a solution.

45. A method as recited in claim 44, wherein said immersing forms on said at least one of said first surface area of said encapsulating layer and said second surface area a species including at least one of a silanol group, an $NH_2$ group, a fluorine group, and an HF group.

46. A method as recited in claim 43, wherein said activating comprises:
exposing said at least one of first said surface area of said encapsulating layer and said second surface area to a plasma.

47. A method as recited in claim 46, wherein said exposing to a plasma comprises:
exposing said at least one of said first surface area of said encapsulating layer and said second surface area to one of an oxygen, nitrogen, argon, $NH_3$ and $CF_4$ plasma process.

48. A method as recited in claim 47, wherein said exposing to a plasma comprises:
conducting said plasma process in one of a reactive ion etch mode, inductively coupled plasma mode, and a sputtering mode.

49. A method as recited in claim 43, wherein said activating produces a surface having one of bonding groups and surface terminating species capable of forming chemical bonds between the encapsulating member and the device carrier at approximately room temperature.

50. A method as recited in claim 49, comprising forming a chemical bond of at least 500 $mJ/m^2$.

51. A method as recited in claim 49, comprising forming a chemical bond in a range of 500-2000$mJ/m^2$.

52. A method as recited in claim 1, comprising:
depositing a polishable material on at least one of said encapsulating member and said device carrier.

53. A method as recited in claim 52, wherein depositing said polishable material comprises depositing at least one of silicon oxide, aluminum oxide, silicon nitride, a spin-on glass, and a dielectric polymer.

54. A method as recited in claim 1, comprising:
annealing to increase a bond strength between said encapsulating member and said device carrier.

55. A method as recited in claim 1, comprising:
encapsulating at least one of an optoelectronic device, a micro-electrical mechanical systems MEMS device, and a radio frequency device.

56. A method as recited in claim 55, comprising:
encapsulating a concave device.

57. A method as recited in claim 55, comprising:
encapsulating a MEMS concave device.

58. A method as recited in claim 55, comprising:
encapsulating a plurality of concave devices.

59. A method as recited in claim 58, wherein encapsulating a plurality of concave devices compartmentalizes each of said plurality of concave devices.

60. A method as recited in claim 55, comprising:
encapsulating a convex device.

61. A method as recited in claim 55, comprising:
encapsulating a convex MEMS device.

62. A method as recited in claim 61, comprising:
encapsulating a plurality of convex devices.

63. A method as recited in claim 62, wherein encapsulating a plurality of convex devices compartmentalizes each of said plurality of convex devices.

64. A method as recited in claim 1, comprising:
forming an interconnection to said device through said device carrier.

65. A method as recited in claim 1, comprising:
forming an interconnection through a side of said encapsulating member.

66. A method as recited in claim 65, further comprising:
providing an opening in a wall of said encapsulating member prior to said bonding such that an interconnect connected to said device is not contacted by said encapsulating member upon said bonding; and
metallizing said opening to complete said encapsulation of said device.

67. A method as recited in claim 66, wherein the metallizing comprises:
electroplating the interconnect to fill said opening.

68. A method as recited in claim 66, wherein the metallizing comprises:
depositing metal selectively on the interconnect to fill said opening.

69. A method as recited in claim 65, wherein forming an interconnection comprises:
forming at least one of an electrical interconnection and an optical interconnection underneath said second surface area of said device carrier.

70. A method as recited in claim 1, further comprising:
etching a trench on said second surface area of said device carrier prior to said bonding;
depositing a metal/dielectric/metal structure in said trench such that an interleaving dielectric layer of the metal/dielectric/metal structure is substantially planar with said second surface area of said device carrier and a metal layer of the metal/dielectric/metal structure connects to a lead of said device; and
bonding said prepared first surface area of said encapsulating member to a portion of said interleaving dielectric layer.

71. A method as recited in claim 1, further comprising:
depositing a metal/dielectric/metal structure on said device carrier such that metal of the metal/dielectric/metal structure connects to a metal lead of said device and said dielectric has a surface roughness of less than 0.5-1 nm and a surface planarity of less than 0.1 μm over a 100 μm range, and
bonding said first surface area of the encapsulation member to said dielectric to form said encapsulation.

72. A method as recited in claim 1, further comprising:
depositing a metal/dielectric/metal structure on said device carrier such that metal of the metal/dielectric/metal structure connects to a lead of said device;
depositing a planarization dielectric on said device carrier and on said interlevel metal/dielectric/metal structure to planarize a portion of said device carrier for said bonding; and
bonding said first surface area of the encapsulating member to the planarization dielectric during to form said encapsulation.

73. A method as recited in claim 1, further comprising:
etching a trench on said second surface area of the device carrier prior to said bonding;
depositing an optical fiber in said trench;
filling said trench with a planarizing dielectric; and
bonding said first surface area of said encapsulating member to a planarized portion of said dielectric.

74. A method as recited in claim 1, further comprising:
etching a trench on said second surface area of said device carrier prior to said bonding;
depositing an optical fiber in said trench;
filling said trench with a metal;
planarizing the metal; and
bonding said first surface area of said encapsulating member to a planarized portion of said metal.

75. A method as recited in claim 1, comprising:
bonding said encapsulation member to said second surface area of said device carrier over a region on said device carrier where an interconnection to said device is desired.

76. A method as recited in claim 75, comprising:
forming a via through said encapsulation member to said device carrier over said region on the device carrier where an interconnection is desired without adversely compromising the encapsulating integrity of the encapsulating member.

77. A method as recited in claim 75, wherein bonding said encapsulating member to said second surface area of said device carrier comprises bonding said encapsulating member to a conductive region in said second surface area forming an interconnection to said device.

78. A method as recited in claim 75, comprising:
bonding said encapsulation member to a non-conductive region in said second surface area;
forming an opening in said non-conductive region to expose a conductive element; and
forming said interconnection to said conductive element.

79. A method as recited in claim 1, comprising:
forming a conductive element on said device carrier;
forming said encapsulating member to have a region over said conductive element and separated from said conductive element by a gap;
forming an aperture in said encapsulating member in said region over said conductive element; and
forming an interconnection to conductive element through said aperture.

80. A method as recited in claim 79, comprising:
forming said encapsulating member to have a gap of approximately between 0.1 and 1.0 microns.

81. A method as recited in claim 79, comprising:
forming conductive material within said aperture electrically connecting to said conductive element and forming a seal between said encapsulation member and said conductive element.

82. A method as recited in claim 1, comprising:
forming a conductive element on said device carrier;
forming said encapsulating member to have a region in contact with said conductive element, but not bonded to said conductive element;
forming an aperture in said encapsulating member in said region over said conductive element; and
forming an interconnection to said conductive element through said aperture.

83. A method as recited in claim 82, comprising:
forming a seal that encapsulates said device.

84. A method as recited in claim 82, comprising:
forming a seal that hermetically encapsulates said device.

85. A method as recited in claim 1, comprising:
bonding at near room temperature said first surface of the encapsulating member to said second surface of the device carrier.

86. A method as recited in claim 1, comprising forming a bond of at least 500 mJ/m$^2$ at near room temperature.

87. A method as recited in claim 86, comprising heating after forming said bond of at least 500 mJ/m$^2$.

88. A method as recited in claim 1, comprising forming a bond in a range of 500-2000 mJ/m$^2$ at near room temperature.

89. A method as recited in claim 1, wherein:
said protecting comprises forming a protective layer on said second surface area.

90. A method as recited in claim 89, comprising:
removing said protective layer after substantially completing fabricating said device.

91. A method as recited in claim 5, wherein:
said range is about 0.5-1 nm.

92. A method as recited in claim 33, wherein said protecting comprises maintaining said surface roughness of said first surface area to no more than about 0.5-1 nm.

93. A method as recited in claim 1, wherein:
said protecting comprises fabricating said device in a manner where said surface roughness of said second surface area is not degraded.

94. A method as recited in claim 43, wherein said activating comprises: exposing at least one of said first surface area of said encapsulating layer and said second surface area to a gas.

95. A method as recited in claim 1, comprising:
protecting substantially only a portion of said device carrier bonded to said encapsulating member.

* * * * *